United States Patent
Takekida

(10) Patent No.: US 11,094,366 B2
(45) Date of Patent: Aug. 17, 2021

(54) SYSTEMS AND METHODS TO CONTROL SEMICONDUCTOR MEMORY DEVICE IN VARIOUS TIMINGS

(71) Applicant: KIOXIA CORPORATION, Tokyo (JP)

(72) Inventor: Hideto Takekida, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/805,379

(22) Filed: Feb. 28, 2020

(65) Prior Publication Data

US 2021/0065773 A1 Mar. 4, 2021

(30) Foreign Application Priority Data

Aug. 28, 2019 (JP) .............................. JP2019-155812

(51) Int. Cl.
| | | |
|---|---|---|
| G11C 7/22 | (2006.01) | |
| G11C 11/4076 | (2006.01) | |
| G11C 11/4074 | (2006.01) | |
| G11C 11/4094 | (2006.01) | |
| G11C 7/10 | (2006.01) | |
| G11C 11/408 | (2006.01) | |
| G11C 16/08 | (2006.01) | |
| G11C 16/04 | (2006.01) | |
| G11C 16/06 | (2006.01) | |
| G11C 16/10 | (2006.01) | |

(52) U.S. Cl.
CPC ........ G11C 11/4076 (2013.01); G11C 7/1045 (2013.01); G11C 7/22 (2013.01); G11C 11/4074 (2013.01); G11C 11/4085 (2013.01); G11C 11/4094 (2013.01); G11C 16/0483 (2013.01); G11C 16/06 (2013.01); G11C 16/08 (2013.01); G11C 16/10 (2013.01)

(58) Field of Classification Search
CPC ..... G11C 11/4076; G11C 16/06; G11C 16/10; G11C 16/08; G11C 16/0483; G11C 11/4094; G11C 7/22; G11C 11/4074; G11C 11/4085; G11C 7/1045
See application file for complete search history.

(56) References Cited

U.S. PATENT DOCUMENTS

| | | | | |
|---|---|---|---|---|
| 2015/0262682 A1* | 9/2015 | Futatsuyama | .......... | G11C 16/10 365/185.22 |
| 2016/0078959 A1* | 3/2016 | Bushnaq | ................ | G11C 16/24 365/185.21 |
| 2016/0267991 A1* | 9/2016 | Hashimoto | ....... | H01L 27/11565 |
| 2018/0218774 A1* | 8/2018 | Kimura | .................... | G11C 16/10 |
| 2018/0254087 A1* | 9/2018 | Yamaoka | ................ | G11C 16/10 |
| 2020/0381052 A1* | 12/2020 | Hioka | ..................... | G11C 16/08 |

* cited by examiner

*Primary Examiner* — Mushfique Siddique
(74) *Attorney, Agent, or Firm* — Foley & Lardner LLP

(57) ABSTRACT

According to an embodiment, a semiconductor memory device includes first and second memory cells and a controller. In a program operation, the controller applies a first voltage to a select gate line at a first timing, applies a second voltage to a select gate line at a second timing, applies a third voltage to a word line at a third timing, and applies a fifth voltage to a word line at a fifth timing. In a program operation when the first memory cell is selected, a time between the second timing and the third timing is a first time. In a program operation when the second memory cell is selected, a time between the second timing and the third timing is a second time different from the first time.

16 Claims, 16 Drawing Sheets

| STRING UNIT | DISCHARGE TIME |
|---|---|
| FIRST GROUP | SETTING 1 |
| SECOND GROUP | SETTING 2 |
| THIRD GROUP | SETTING 3 |

SYSTEMS AND METHODS TO CONTROL SEMICONDUCTOR MEMORY DEVICE IN VARIOUS TIMINGS

CROSS-REFERENCE TO RELATED APPLICATION(S)

This application is based upon and claims the benefit of priority from Japanese Patent Application No. 2019-155812, filed Aug. 28, 2019, the entire contents of which are incorporated herein by reference.

FIELD

Embodiments described herein relate generally to a semiconductor memory device.

BACKGROUND

A NAND-type flash memory is known as high integrality one in electrically rewritable and non-volatile semiconductor memories (EEPROMs). In the NAND-type flash memory, a plurality of memory cells are connected in series in such a manner that adjacent two memory cells share a source/drain diffusion layer to constitute a NAND cell unit. The both ends of the NAND cell unit are coupled to a bit line and a source line via select gate transistors, respectively. With such the NAND cell unit structure, the NAND-type flash may be formed to have a smaller unit cell area than that of a NOR-type flash memory, and have a large capacity.

Examples of related art include JP-A-2016-267991.

DETAILED DESCRIPTION

Figure 1:
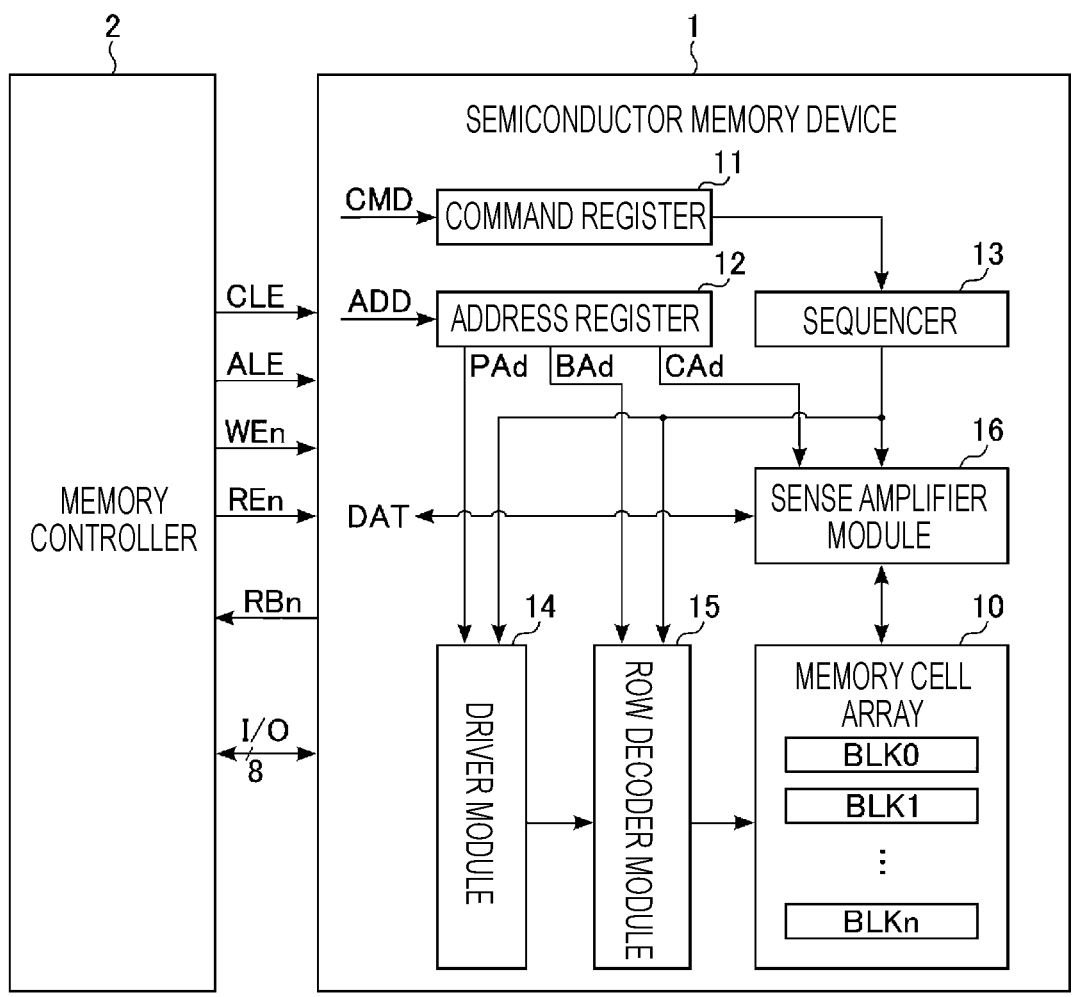
FIG. 1 is a block diagram illustrating an example of a configuration of a semiconductor memory device according to a first embodiment.

The generation of error bits is prevented, and the total time for a write operation is reduced.

In general, according to one embodiment, a semiconductor memory device includes: first and second memory cells; a word line; first and second bit lines; first and second select transistors; first and second select gate lines; and a controller. The word line is connected to the first and second memory cells. The first and second bit lines are connected to the first and second memory cells, respectively. The first select transistor is connected between the first memory cell and the first bit line. The second select transistor is connected between the second memory cell and the second bit line. The first and second gate lines are connected to the first and second select transistors, respectively. The controller is configured to execute a write operation that includes a program operation. In the program operation, the controller is configured to apply a first voltage to the first select gate line and the second select gate line at a first timing, apply a second voltage lower than the first voltage to the first select gate line and the second select gate line at a second timing after the first timing, apply a third voltage higher than the second voltage to the word line at a third timing after the second timing, apply a fourth voltage, between the first voltage and the second voltage, to the first select gate line at a fourth timing after the second timing when the first memory cell is selected or to the second select gate line at the fourth timing when the second memory cell is selected, and apply a fifth voltage higher than the third voltage to the word line at a fifth timing after the third timing. In the program operation when the first memory cell is selected, a first time period is a difference between the second and third timings. In the program operation when the second memory cell is selected, a second time period is a difference between the second and third timings. The second time period is different from the first time period.

Hereinafter, embodiments will be described with reference to the accompanying drawings. Each embodiment describes an apparatus or a method for embodying the technical idea of the present disclosure. The drawings are schematic or conceptual, and the dimensions, ratios, etc., of the drawings may not necessarily be the same as actual dimensions, ratios, etc. The technical idea of the present disclosure may not be specified by shapes, structures, arrangements, etc. of components.

In addition, in the following descriptions, components having a substantially similar function or configuration will be denoted by the same reference numeral. Numerals followed by a character to make up a reference numeral are referred to by the reference numeral including the same character, and are used to distinguish components having a similar configuration from each other. When it is unnecessary to distinguish components indicated by reference numerals including the same character, each of the components will be referred to by the reference numeral including only the character.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

FIG. 1 represents an example of a configuration of the semiconductor memory device 1 according to the first embodiment. The semiconductor memory device 1 is a NAND type flash memory capable of storing data in a nonvolatile manner, and is controllable by an external memory controller 2. As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK includes a set of a plurality of memory cells capable of storing data in a nonvolatile manner, and for example, is used as a unit of data erase. Further, the memory cell array 10 is provided with a plurality of bit lines and a plurality of word lines. Each memory cell is associated with, for example, one bit line and one word line. The detailed configuration of the memory cell array 10 will be described later.

The command register 11 stores a command CMD received by the semiconductor memory device 1 from the memory controller 2. The command CMD includes, for example, a command for causing the sequencer 13 to execute a read operation, a write operation, an erase operation, etc.

The address register 12 stores address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the entire operation of the semiconductor memory device 1. For example, the sequencer 13 controls the driver module 14, the row decoder module 15, the sense amplifier module 16, etc., based on the command CMD stored in the command register 11, so as to execute a read operation, a write operation, an erase operation, etc.

The driver module 14 generates voltages used for a read operation, a write operation, an erase operation, etc. Then, for example, the driver module 14 applies a generated voltage to a signal line corresponding to a selected word line, based on the page address PAd stored in the address register 12.

The row decoder module 15 selects one block BLK in a corresponding memory cell array 10, based on the block address BAd stored in the address register 12. Then, for example, the row decoder module 15 transfers the voltage applied to the signal line corresponding to the selected word line, to a selected word line in the selected block BLK.

In a write operation, the sense amplifier module 16 applies a desired voltage to each bit line, according to write data DAT received from the memory controller 2. Further, in a read operation, the sense amplifier module 16 determines data stored in a memory cell based on the voltage of the bit line, reads the determination result, and transfers the read determination result as data DAT to the memory controller 2.

The communication between the semiconductor memory device 1 and the memory controller 2 supports, for example, the NAND interface standard. For example, in the communication between the semiconductor memory device 1 and the memory controller 2, a command latch enable signal CLE, an address latch enable signal ALE, a write enable signal WEn, a read enable signal REn, a ready busy signal RBn, and an input/output signal I/O are used.

The command latch enable signal CLE is a signal indicating that an input/output signal I/O received by the semiconductor memory device 1 is a command CMD. The address latch enable signal ALE is a signal indicating that an input/output signal I/O received by the semiconductor memory device 1 is address information ADD. The write enable signal WEn is a signal for instructing the semiconductor memory device 1 to input an input/output signal I/O. The read enable signal REn is a signal for instructing the semiconductor memory device 1 to output an input/output signal I/O. The ready/busy signal RBn is a signal for notifying the memory controller 2 of whether the semiconductor memory device 1 is in a ready state or a busy state. The ready state is a state where the semiconductor memory device 1 receives a command, and the busy state is a state where the semiconductor memory device 1 does not receive a command. The input/output signal I/O is, for example, an 8-bit width signal and may include, for example, a command CMD, address information ADD, data DAT, etc.

The combination of the semiconductor memory device 1 and the memory controller 2 described above may constitute a single semiconductor device. The semiconductor device may be, for example, a memory card such as an SD™ card, an SSD (solid state drive) or the like.

[1-1-2] Circuit Configuration of Semiconductor Memory Device 1

(Circuit Configuration of Memory Cell Array 10)

Figure 2:
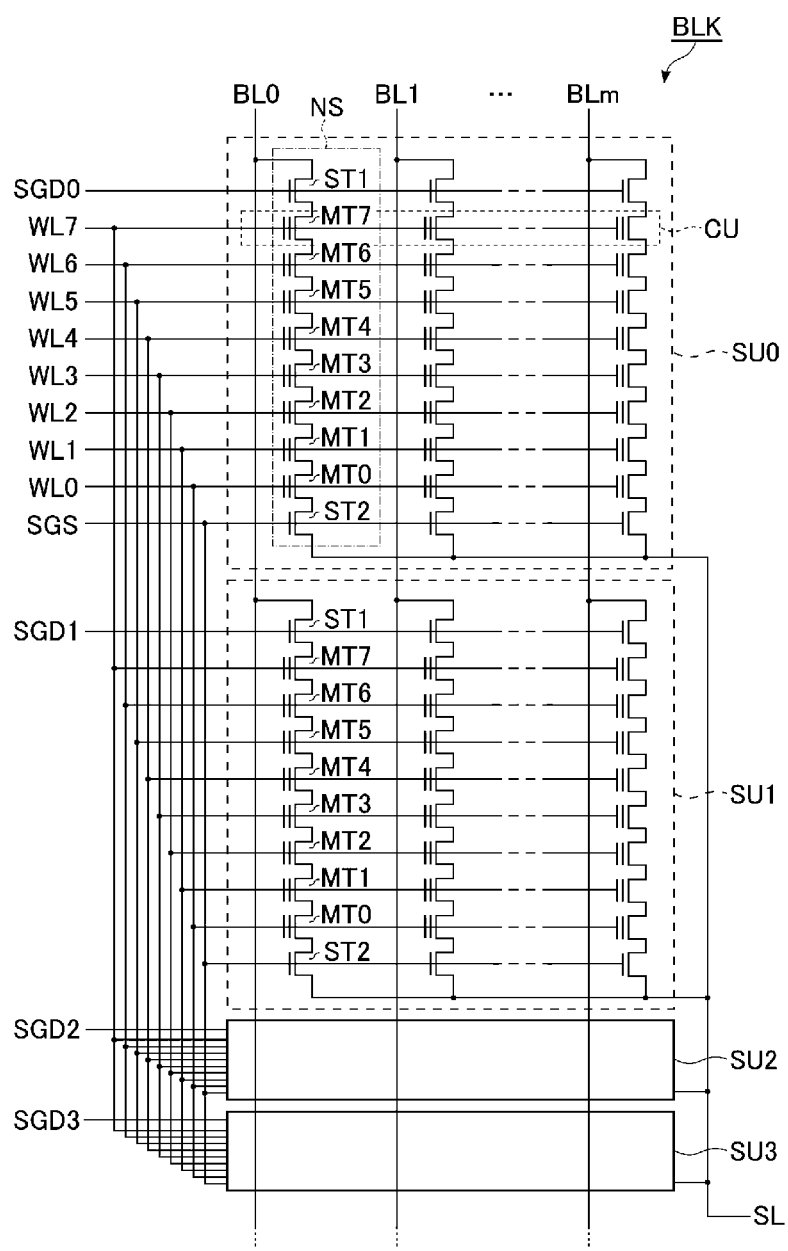
FIG. 2 is a circuit diagram illustrating an example of a circuit configuration of a memory cell array provided in the semiconductor memory device according to the first embodiment.

FIG. 2 represents an example of a circuit configuration of the memory cell array 10 provided in the semiconductor memory device 1 according to the first embodiment, by extracting one block BLK from the plurality of blocks BLK in the memory cell array 10. As illustrated in FIG. 2, the block BLK includes, for example, four string units SU0 to SU3.

Each string unit SU includes a plurality of NAND strings NS that are associated with bit lines BL0 to BLm (m is an integer of 1 or more), respectively. Each NAND string NS includes, for example, memory cell transistors MT0 to MT7 and select transistors ST1 and ST2. The memory cell transistor MT includes a control gate and a charge storage layer, and stores data in a nonvolatile manner. Each of select transistors ST1 and ST2 is used for a selection of a string unit SU at the time of various operations.

In each NAND string NS, the memory cell transistors MT0 to MT7 are connected to each other in series. The drain of the select transistor ST1 is connected to the associated bit line BL, and the source of the select transistor ST1 is connected to one end of the memory cell transistors MT0 to MT7 connected to each other in series. The drain of the select transistor ST2 is connected to the other end of the memory cell transistors MT0 to MT7 connected to each other in series. The source of the select transistor ST2 is connected to a source line SL.

In the same block BLK, the control gates of the memory cell transistors MT0 to MT7 are connected in common to word lines WL0 to WL7, respectively. The gates of the select transistors ST1 in the string units SU0 to SU3 are connected in common to select gate lines SGD0 to SGD3, respectively. The gates of the select transistors ST2 in the same block BLK are connected in common to a select gate line SGS.

In the circuit configuration of the memory cell array 10 described above, the bit line BL is shared by NAND strings NS to which the same column address is allocated, in the respective string units SU. The source line SL is shared, for example, among the plurality of blocks BLK.

A set of a plurality of memory cell transistors MT connected to the common word line WL within one string unit SU will be referred to as, for example, a cell unit CU. For example, the storage capacity of a cell unit CU that includes the memory cell transistors MT each storing 1-bit data is defined as "one page data." The cell unit CU may have a storage capacity of two or more page data, according to the number of bits of data stored in a memory cell transistor MT.

In addition, the circuit configuration of the memory cell array 10 provided in the semiconductor memory device 1 according to the first embodiment is not limited to the configuration described above. For example, the number of string units SU in each block BLK, the number of memory cell transistors MT and the number of select transistors ST1 and ST2 in each NAND string NS may be selected freely.

(Circuit Configuration of Row Decoder Module 15)

Figure 3:
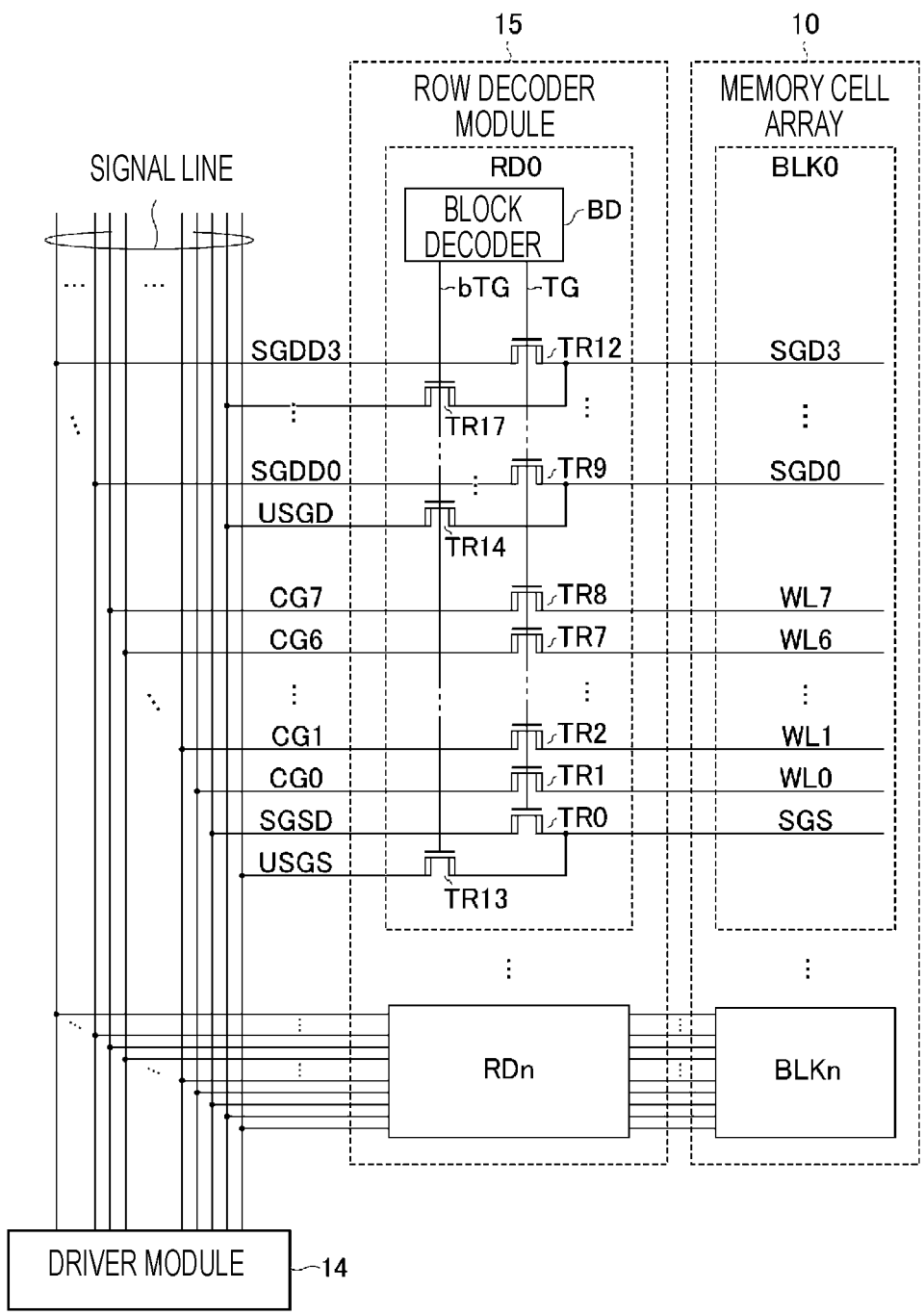
FIG. 3 is a circuit diagram illustrating an example of a circuit configuration of a row decoder module provided in the semiconductor memory device according to the first embodiment.

FIG. 3 represents an example of a circuit configuration of the row decoder module 15 provided in the semiconductor memory device 1 according to the first embodiment. As illustrated in FIG. 3, the row decoder module 15 includes, for example, row decoders RD0 to RDn, and is connected to the driver module 14 via signal lines CG0 to CG7, SGDD0 to SGDD3, SGSD, USGD, and USGS.

Hereinafter, a detailed circuit configuration of the row decoder RD will be described focusing on the row decoder RD0 that corresponds to the block BLK0. The row decoder RD includes, for example, a block decoder BD, transfer gate lines TG and bTG, and transistors TR0 to TR17.

The block decoder BD decodes the block address BAd. Then, the block decoder BD applies a predetermined voltage to each of the transfer gate lines TG and bTG based on the decoding result. The voltage applied to the transfer gate line TG and the voltage applied to the transfer gate line bTG have a complementary relationship. In other words, an inversion signal of the transfer gate line TG is input to the transfer gate line TGb.

Each of the transistors TR0 to TR17 is a high-breakdown-voltage N-type MOS transistor. The gates of the transistors TR0 to TR12 are connected in common to the transfer gate line TG. The gates of the transistors TR13 to TR17 are connected in common to the transfer gate line bTG. In addition, each transistor TR is connected between the signal lines wired from the driver module 14 and the wirings provided in the corresponding block BLK.

Specifically, the drain of the transistor TR0 is connected to the signal line SGSD. The source of the transistor TR0 is connected to the select gate line SGS. The drains of the transistors TR1 to TR8 are connected to the signal lines CG0 to CG7, respectively. The sources of the transistors TR1 to TR8 are connected to the word lines WL0 to WL7, respectively. The drains of the transistors TR9 to TR12 are connected to the signal lines SGDD0 to SGDD3, respectively. The sources of the transistors TR9 to TR12 are connected to the select gate lines SGD0 to SGD3, respectively. The drain of the transistor TR13 is connected to the signal line USGS. The source of the transistor TR13 is connected to the select gate line SGS. The drains of the transistors TR14 to TR17 are connected in common to the signal line USGD. The sources of the transistors TR14 to TR17 are connected to the select gate lines SGD0 to SGD3, respectively.

That is, the signal lines CG0 to CG7 are used as global word lines shared among the plurality of blocks BLK, and the word lines WL0 to WL7 are used as local word lines provided for each block. Further, the signal lines SGDD0 to SGDD3 and SGSD are used as global transfer gate lines shared among the plurality of blocks BLK, and the select gate lines SGD0 to SGD3 and SGS are used as local transfer gate lines provided for each block.

With the configuration described above, the row decoder module 15 may select a block BLK. Specifically, in various operations, a block decoder BD that corresponds to a selected block BLK applies voltages of "H" and "L" levels to the transfer gate lines TG and bTG, respectively, and a block decoder BD that corresponds to an unselected block BLK applies voltages of "L" and "H" levels to the transfer gate lines TG and bTG, respectively.

In addition, the circuit configuration of the row decoder module 15 described above is merely an example, and may be appropriately changed. For example, the number of transistors TR in the row decoder module 15 is designed based on the number of wirings provided in each block BLK.

(Circuit Configuration of Sense Amplifier Module 16)

Figure 4:
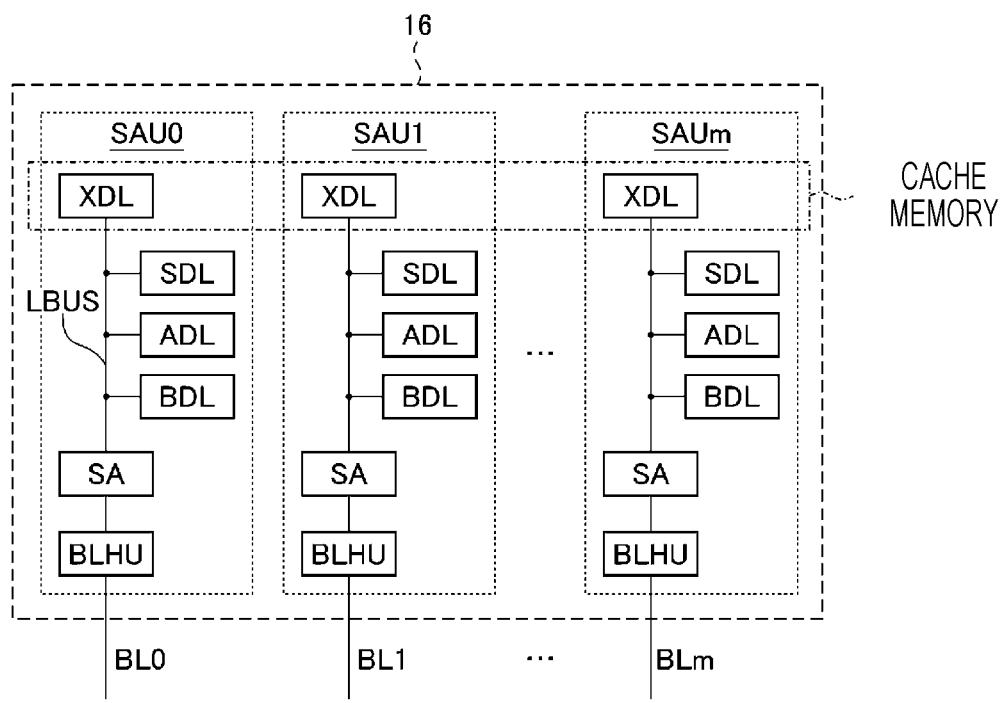
FIG. 4 is a circuit diagram illustrating an example of a circuit configuration of a sense amplifier module provided in the semiconductor memory device according to the first embodiment.

FIG. 4 represents an example of a circuit configuration of the sense amplifier module 16 provided in the semiconductor memory device 1 according to the first embodiment. As illustrated in FIG. 4, the sense amplifier module 16 includes, for example, sense amplifier units SAU0 to SAUm. The sense amplifier units SAU0 to SAUm are associated with the bit lines BL0 to BLm, respectively. Each sense amplifier unit SAU includes, for example, a bit line connection unit BLHU, a sense amplifier SA, a bus LBUS, and latch circuits SDL, ADL, BDL, and XDL.

The bit line connection unit BLHU is connected between an associated bit line BL and the sense amplifier SA. For example, in the read operation, the sense amplifier SA determines whether read data is "0" or "1," based on the voltage of the associated bit line BL. In other words, the sense amplifier SA senses data read to the associated bit line BL, to determine data to be stored in a selected memory cell. Each of the latch circuits SDL, ADL, BDL, and XDL temporarily stores read data, write data, etc.

The sense amplifier SA and the latch circuits SDL, ADL, BDL, and XDL are each connected to the bus LBUS, and may transmit/receive data to/from each other via the bus LBUS. The latch circuit XDL is connected to an input/output circuit (not illustrated), and used for input/output of data between the sense amplifier unit SAU and the input/output circuit. Further, the latch circuit XDL may also be used as, for example, a cache memory of the semiconductor memory device 1. For example, the semiconductor memory device 1 may become the ready state when the latch circuit XDL is vacant, even though the latch circuits SDL, ADL, and BDL are being used.

Figure 5:
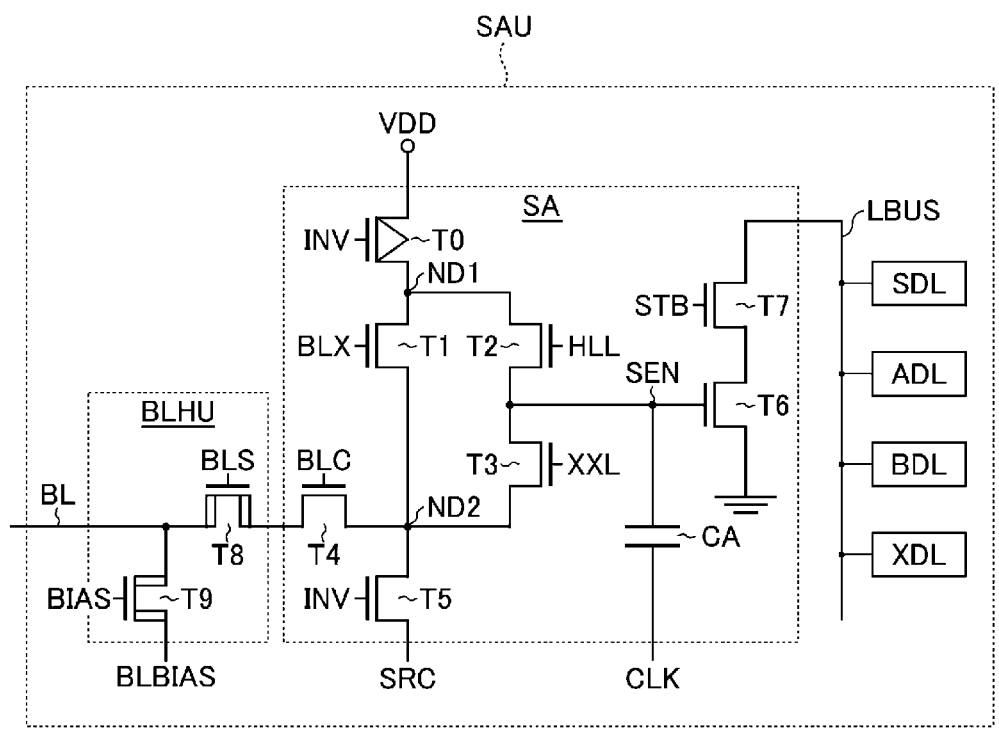
FIG. 5 is a circuit diagram illustrating an example of a circuit configuration of a sense amplifier unit in the sense amplifier module provided in the semiconductor memory device according to the first embodiment.

FIG. 5 represents an example of a circuit configuration of the sense amplifier unit SAU in the sense amplifier module 16 provided in the semiconductor memory device 1 according to the first embodiment. As illustrated in FIG. 5, for example, the sense amplifier SA includes transistors T0 to T7 and a capacitor CA, and the bit line connection unit BLHU includes transistors T8 and T9. For example, the transistor T0 is a P-type MOS transistor. Each of the transistors T1 to T7 is an N-type MOS transistor. Each of the transistors T8 and T9 is an N-type MOS transistor having a higher breakdown voltage than each of the transistors T0 to T7.

The source of the transistor T0 is connected to a power supply line. The drain of the transistor T0 is connected to a node ND1. The gate of the transistor T0 is connected to, for example, a node INV in the latch circuit SDL. The drain of the transistor T1 is connected to the node ND1. The source of the transistor T1 is connected to a node ND2. A control signal BLX is input to the gate of the transistor T. The drain of the transistor T2 is connected to the node ND1. The source of the transistor T2 is connected to a node SEN. A control signal HLL is input to the gate of the transistor T2.

The drain of the transistor T3 is connected to the node SEN. The source of the transistor T3 is connected to the node ND2. A control signal XXL is input to the gate of the transistor T3. The drain of the transistor T4 is connected to the node ND2. A control signal BLC is input to the gate of the transistor T4. The drain of the transistor T5 is connected to the node ND2. The source of the transistor T5 is connected to a node SRC. The gate of the transistor T5 is connected to, for example, the node INV in the latch circuit SDL.

The source of the transistor T6 is grounded. The gate of the transistor T6 is connected to the node SEN. The drain of the transistor T6 is connected to the bus LBUS. The source of the transistor T7 is connected to the drain of the transistor T6. A control signal STB is input to the gate of the transistor T7. One electrode of the capacitor CA is connected to the node SEN. A clock CLK is input to the other electrode of the capacitor CA.

The drain of the transistor T8 is connected to the source of the transistor T4. The source of the transistor T8 is connected to the bit line BL. A control signal BLS is input to the gate of the transistor T8. The drain of the transistor T9 is connected to a node BLBIAS. The source of the transistor T9 is connected to the bit line BL. A control signal BIAS is input to the gate of the transistor T9.

In the circuit configuration of the sense amplifier unit SAU described above, for example, a power supply voltage VDD is applied to the power supply line connected to the source of the transistor T0. For example, a ground voltage VSS is applied to the node SRC. For example, an erase voltage VERA is applied to the node BLBIAS. Each of the control signals BLX, HLL, XXL, BLC, STB, BLS, and BIAS and the clock CLK is generated by, for example, the sequencer 13. The sense amplifier SA determines data read to the bit line BL based on a timing when, for example, the control signal STB is asserted.

In addition, the sense amplifier module 16 provided in the semiconductor memory device 1 according to the embodiment is not limited to the circuit configuration described above. For example, the number of latch circuits in each sense amplifier unit SAU may be appropriately changed based on the number of pages to be stored in one cell unit CU. The sense amplifier SA may have another circuit configuration as long as data read to the bit line BL may be determined.

[1-1-3] Structure of Semiconductor Memory Device 1

Hereinafter, descriptions will be made on an example of the structure of the memory cell array 10 provided in the semiconductor memory device 1 according to the first embodiment. In the drawings referred-to herein below, the X direction corresponds to the extending direction of the word lines WL, the Y direction corresponds to the extending direction of the bit lines BL, and the Z direction corresponds to the direction perpendicular to the surface of a semiconductor substrate used for forming the semiconductor memory device 1. In a plan view, hatching is appropriately added for easy viewing of the drawing. The hatching added to the plan view is not necessarily related to a material or characteristic of a component to which the hatching is added. In a cross-sectional view, the illustration of wirings, contacts, interlayer insulating films, etc., is appropriately omitted for easy viewing of the drawing.

(Planar Layout of Memory Cell Array 10)

Figure 6:
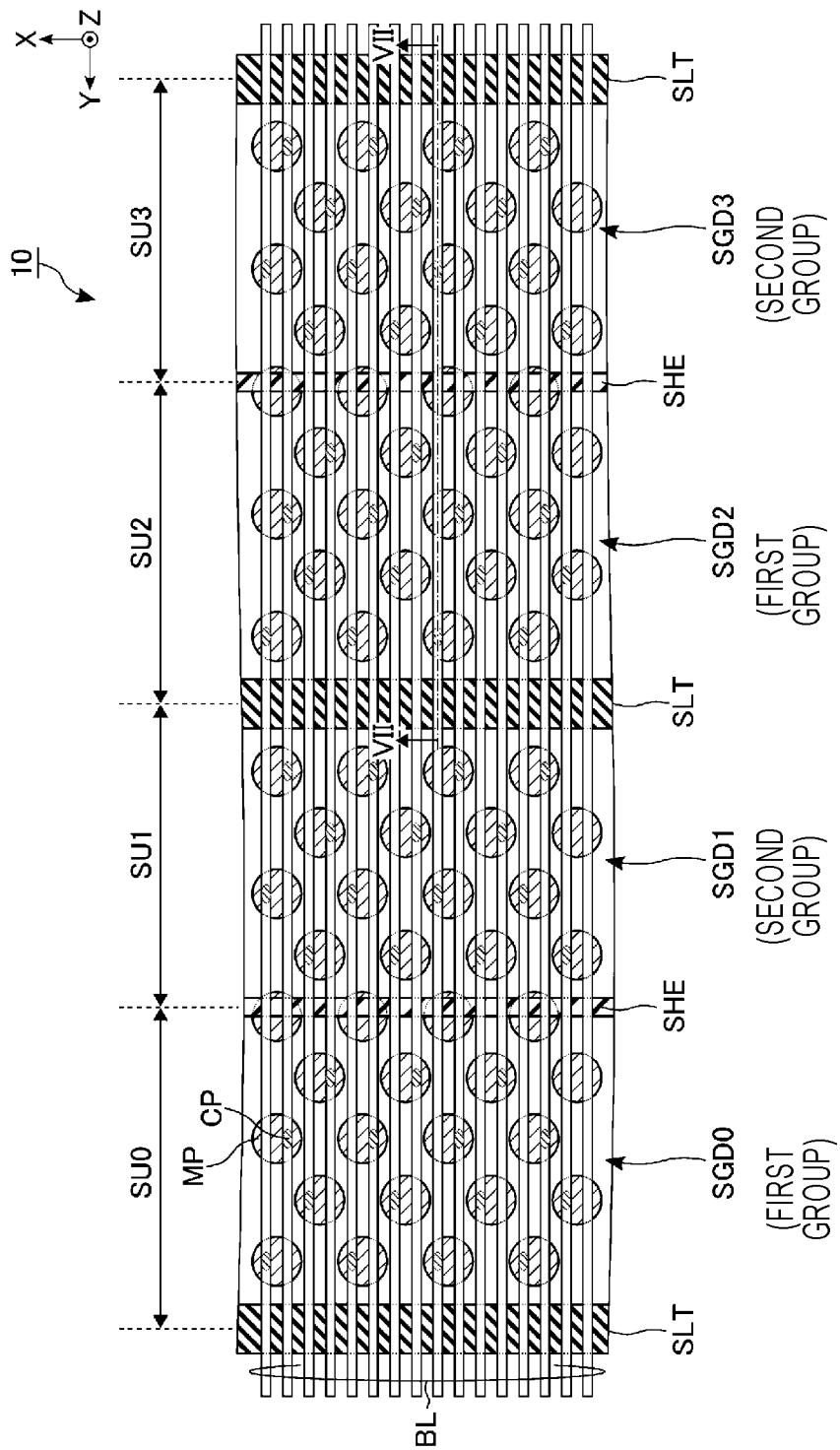
FIG. 6 is planar view illustrating an example of a planar layout of the memory cell array provided in the semiconductor memory device according to the first embodiment.

FIG. 6 is an example of a planar layout of the memory cell array 10 provided in the semiconductor memory device 1 according to the first embodiment, and represents an extracted area that corresponds to one block BLK (i.e., the string units SU0 to SU3). As illustrated in FIG. 6, the memory cell array 10 includes a plurality of slits SLT, a plurality of slits SHE, a plurality of memory pillars MP, a plurality of bit lines BL, and a plurality of contacts CP.

The plurality of slits SLT each have a portion that extends along the X direction, and are arranged in the Y direction. Each slit SLT has a structure in which an insulating member is embedded therein, and adjacent conductor layers are divided (insulated) through the corresponding slit. Specifically, the slits SLT divide the word lines WL0 to WL7 and the select gate lines SGD and SGS.

The plurality of slits SHE each have a portion that extends along the X direction, and for example, one slit SHE is arranged between adjacent slits SLT. Each slit SHE has a structure in which an insulating member is embedded therein, and adjacent conductor layers are divided (insulated) through the corresponding slit. Specifically, the slits SHE divide at least the select gate lines SGD.

Each memory pillar MP functions as, for example, one NAND string NS. The plurality of memory pillars MP are arranged, for example, in a staggered pattern of nine rows in the area between adjacent slits SLT. The number and the arrangement of the memory pillars MP between adjacent slits SLT are not limited to the staggered pattern of nine rows, and may be appropriately changed. In addition, for example, the memory pillars MP arranged in the X direction at the central portion between adjacent slits SLT are arranged to overlap with the slit SHE. That is, for example, the plurality of memory pillars MP include memory pillars MP that are partly divided by the slit SHE and are in contact with the adjacent select gate line SGD.

The plurality of bit lines BL each have a portion that extends in the Y direction and are arranged in the X direction. Each bit line BL is arranged to overlap with at least one memory pillar MP for each string unit SU. In the present example, two bit lines BL are arranged to overlap with each memory pillar MP. In addition, the number of bit lines BL that overlap with each memory pillar MP is not limited to two, and may be any number.

Each contact CP is provided between one bit line BL among the plurality of bit lines BL overlapping with a memory pillar MP, and the memory pillar MP. Each memory pillar MP is electrically connected to a corresponding bit line BL via the contact CP. In addition, a contact CP between a memory pillar MP overlapping with the slit SHE and a bit line BL is omitted. In other words, a contact CP between a memory pillar MP in contact with two different select gate lines SGD and a bit line BL is omitted.

In the planar layout of the memory cell array 10 described above, each of the areas defined by the slits SLT and SHE corresponds to one string unit SU. That is, in the present example, the string units SU0 to SU3 that each extend in the X direction are arranged in the Y direction. In addition, in the memory cell array 10, for example, the layout illustrated in FIG. 6 is repeatedly arranged in the Y direction.

The interval between adjacent slits SLT is designed to be, for example, substantially constant. Meanwhile, the arrangement of the slit SHE between adjacent slits SLT may shift, for example, in the Y direction due to manufacturing variations. In the present example, the slit SHE between the string units SU0 and SU1 shifts to the side of the string unit SU1, and the slit SHE between the string units SU2 and SU3 shifts to the side of the string unit SU3.

In this case, the resistance value of the select gate line SGD0 that corresponds to the string unit SU0 becomes lower than the resistance value of the select gate line SGD1 that corresponds to the string unit SU1, and the resistance value of the select gate line SGD2 that corresponds to the string unit SU2 becomes lower than the resistance value of the select gate line SGD3 that corresponds to the string unit SU3. In the first embodiment, it is assumed that the select gate lines SGD0 and SGD2 having the low resistance value are classified into a first group, and the select gate lines SGD1 and SGD3 having the high resistance value are classified into a second group.

(Cross-Sectional Structure of Memory Cell Array 10)

Figure 7:
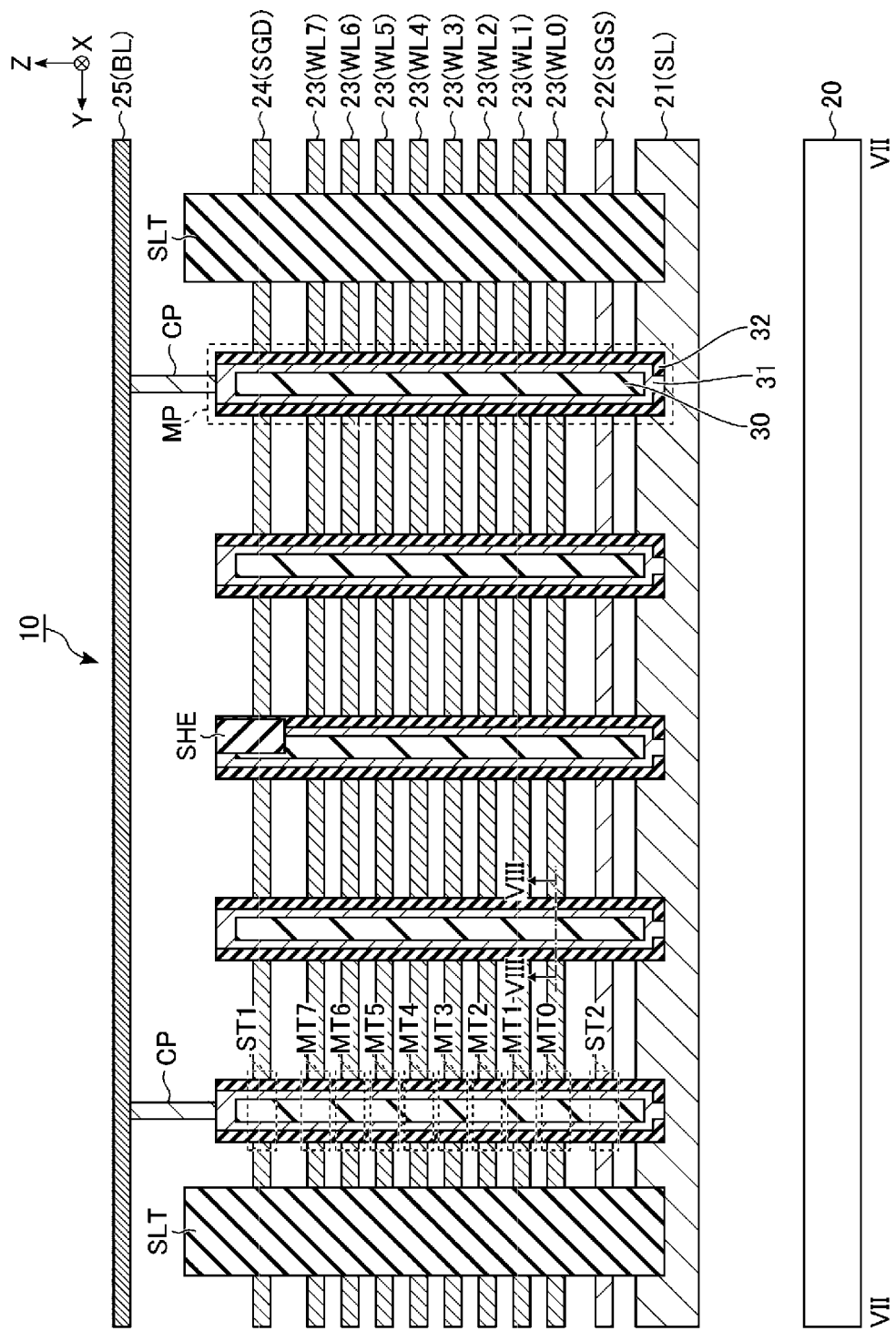
FIG. 7 is a cross-sectional view illustrating an example of a cross-sectional structure of the memory cell array provided in the semiconductor memory device according to the first embodiment.

FIG. 7 is a cross-sectional view taken along the VII-VII line of FIG. 6, and represents an example of a cross-sectional structure of the memory cell array 10 provided in the semiconductor memory device 1 according to the first embodiment. As illustrated in FIG. 7, the memory cell array 10 includes conductor layers 21 to 25. The conductor layers 21 to 25 are provided above a semiconductor substrate 20.

Specifically, the conductor layer 21 is provided above the semiconductor substrate 20 via an insulator layer. Although not illustrated, a circuit corresponding to, for example, the row decoder module 15 or the sense amplifier module 16 is provided in the insulator layer between the semiconductor substrate 20 and the conductor layer 21. For example, the conductor layer 21 is formed in a plate shape that extends along the XY plane, and is used as the source line SL. The conductor layer 21 includes, for example, silicon doped with phosphorus.

The conductor layer 22 is provided above the conductor layer 21 via an insulator layer. For example, the conductor layer 22 is formed in a plate shape that extends along the XY plane, and is used as the select gate line SGS. The conductor layer 22 includes, for example, silicon doped with phosphorus.

An insulator layer and the conductor layer 23 are alternately stacked above the conductor layer 22. The conductor layer 23 is formed, for example, in a plate shape that extends along the XY plane. The plurality of stacked conductor layers 23 are used as the word lines WL0 to WL7 in an order from the side of the semiconductor substrate 20. The conductor layer 23 includes, for example, tungsten.

The conductor layer 24 is provided above the uppermost conductor layer 23 via an insulator layer. The conductor layer 24 is formed, for example, in a plate shape that extends along the XY plane. The conductor layer 24 is used as the select gate line SGD. The conductor layer 24 includes, for example, tungsten.

The conductor layer 25 is provided above the conductor layer 24 via an insulator layer. The conductor layer 25 is formed, for example, in a line shape that extends along the Y direction, and is used as the bit line BL. That is, in an area not illustrated, a plurality of conductor layers 25 are arranged along the X direction. The conductor layer 25 includes, for example, copper.

Each memory pillar MP extends along the Z direction and penetrates the conductor layers 22 to 24. Further, each memory pillar MP includes, for example, a core member 30, a semiconductor layer 31, and a stacked film 32. The core member 30 extends along the Z direction. For example, the upper end of the core member 30 is in the upper layer than the uppermost conductor layer 24, and the lower end of the core member 30 is in the layer in which the conductor layer 21 is provided. The semiconductor layer 31 covers, for example, the periphery of the core member 30. A portion of the lateral surface of the semiconductor layer 31 at the lower portion of the memory pillar MP is in contact with the conductor layer 21. The stacked film 32 covers the lateral surfaces and the bottom surface of the semiconductor layer 31, except for the portion where the semiconductor layer 31 and the conductor layer 21 are in contact with each other. The core member 30 includes, for example, an insulator such as silicon oxide. The semiconductor layer 31 includes, for example, silicon.

The contact CP is provided in a columnar shape on the semiconductor layer 31 in the memory pillar MP. In the illustrated area, contacts CP that correspond to two memory pillars MP among the five memory pillars MP are represented. The memory pillar MP that does not overlap with the slit SHE and is not connected with a contact CP in the corresponding area is connected with a contact CP in an area not illustrated. One conductor layer 25, that is, one bit line BL is in contact with the upper surface of the contact CP. One contact CP is electrically connected to one conductor layer 25 in each of the spaces defined by the slits SLT and SHE.

The slit SLT is formed, for example, in a plate shape that extends along the XZ plane, and divides the conductor layers 22 to 24. The upper end of the slit SLT is in the layer between the conductor layers 24 and 25. The lower end of the slit SLT is, for example, in the layer in which the conductor layer 21 is provided. The slit SLT includes, for example, an insulator such as silicon oxide. A plate-shaped contact may be formed in the slit SLT. In this case, the plate-shaped contact is connected to the source line SL, for the insulation between the contact and the conductor layers 22 to 24.

The slit SHE is formed, for example, in a plate shape that extends along the X direction, and divides the conductor layer 24. The upper end of the slit SHE is in the layer between the conductor layers 24 and 25. The lower end of the slit SHE is in the layer between the uppermost conductive layer 23 and the conductive layer 24. The slit SHE includes, for example, an insulator such as silicon oxide. The upper end of the slit SHE and the upper end of the memory pillar MP may be or may not be aligned at the same height. Further, the slit SHE may be divided by the memory pillar MP.

In the structure of the memory pillar MP described above, the portion where the memory pillar MP and the conductor layer 22 intersect each other functions as the select transistor ST2. The portions where the memory pillar MP and the conductor layers 23 intersect each other function as the memory cell transistors MT. The portion where the memory pillar MP and the conductor layer 24 intersect each other functions as the select transistor ST1.

Figure 8:
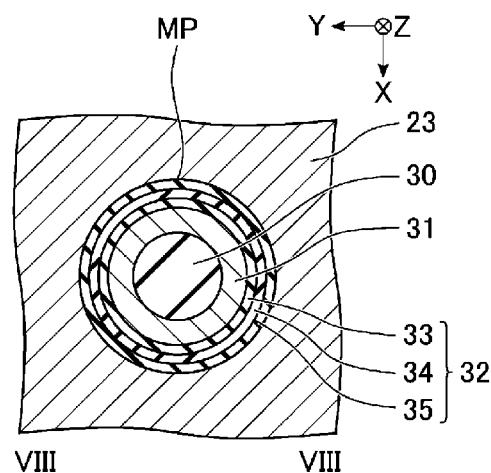
FIG. 8 is a cross-sectional view taken along the VIII-VIII line of FIG. 7 and illustrates an example of a cross-sectional structure of a memory pillar in the semiconductor memory device according to the first embodiment.

FIG. 8 is a cross-sectional view taken along the VIII-VIII line of FIG. 7, and represents an example of a cross-sectional structure of the memory pillar MP in the semiconductor memory device 1 according to the first embodiment. More specifically, FIG. 8 represents a cross-sectional structure of the memory pillar MP in the layer parallel to the surface of the semiconductor substrate 20 and including the conductor layer 23. As illustrated in FIG. 8, the stacked film 32 in the memory pillar MP includes, for example, a tunnel insulating film 33, an insulating film 34, and a block insulating film 35.

In the layer including the conductor layer 23, the core member 30 is provided, for example, at the center of the memory pillar MP. The semiconductor layer 31 surrounds the lateral surface of the core member 30. The tunnel insulating film 33 surrounds the lateral surface of the semiconductor layer 31. The insulating film 34 surrounds the lateral surface of the tunnel insulating film 33. The block insulating film 35 surrounds the lateral surface of the insulating film 34. The conductor layer 23 surrounds the lateral surface of the block insulating film 35.

The semiconductor layer 31 is used as a channel for the memory cell transistors MT0 to MT7 and the select transistors ST1 and ST2. Each of the tunnel insulating film 33 and the block insulating film 35 includes, for example, silicon oxide. The insulating film 34 is used as a charge storage layer of the memory cell transistor MT and includes, for example, silicon nitride. Thus, each memory pillar MP functions as one NAND string NS.

[1-1-4] Data Storing Method

Figure 9:
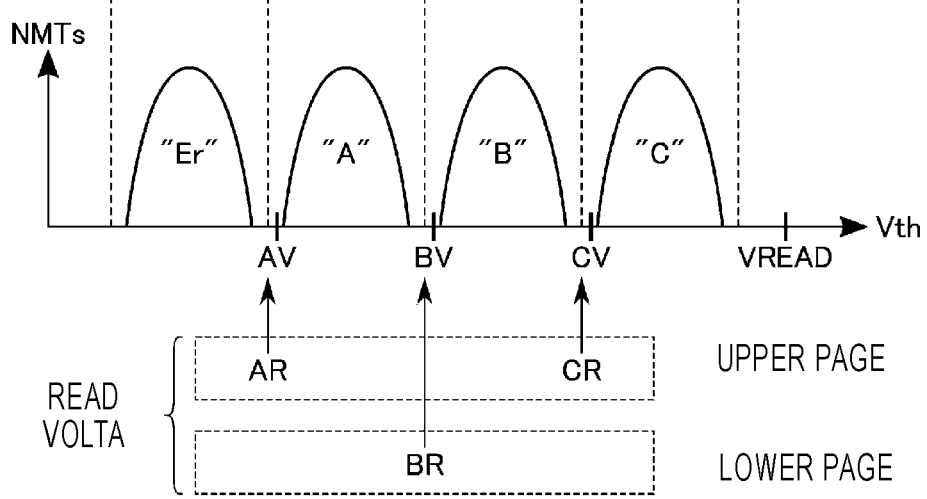
FIG. 9 is a view illustrating an example of data allocation applied to a memory cell transistor in the semiconductor memory device according to the first embodiment.

FIG. 9 represents an example of threshold voltage distributions of the memory cell transistors MT, read voltages, and verify voltages in the semiconductor memory device 1 according to the first embodiment. In addition, in the threshold voltage distribution diagram referred-to below, the vertical axis NMTs corresponds to the number of memory cell transistors MT, and the horizontal axis Vth corresponds to the threshold voltages of the memory cell transistors MT.

As illustrated in FIG. 9, in the semiconductor memory device 1 according to the first embodiment, four types of threshold distributions are formed by the plurality of memory cell transistors MT. The four types of threshold distributions will be referred to as, for example, "Er" state, "A" state, "B" state, and "C" state in an order from the lowest threshold voltage. The "Er" state corresponds to an erased state of the memory cell transistor MT. Each of the "A" state, the "B" state, and the "C" state corresponds to a state where data is written to the memory cell transistor MT.

Further, a setting is made such that different 2-bit data are allocated to the "Er" state, the "A" state, the "B" state, and the "C" state, respectively, and two adjacent states are different from each other in only 1-bit data. A method of storing 2-bit data in one memory cell transistor as described above is called, for example, a multi-level cell (MLC) method. An example of the data allocation to the four types of threshold voltage distributions is described below.

"Er" state: "11 (upper bit/lower bit)" data
"A" state: "01" data
"B" state: "00" data
"C" state: "10" data A verify voltage to be used in the write operation is set between adjacent states. Specifically, a verify voltage AV is set between the "Er" state and the "A" state, a verify voltage BV is set between the "A" state and the "B" state, and a verify voltage CV is set between the "B" state and the "C" state.

The verify voltages AV, BV, and CV are used for programs of the "A" state, the "B" state, and the "C" state, respectively. In the write operation, when it is detected that the threshold voltage of the memory cell transistor MT for storing any data exceeds a verify voltage corresponding to the data, the semiconductor memory device 1 completes the program for the memory cell transistor MT.

Further, a read voltage to be used in the read operation is set between adjacent states. Specifically, a read voltage AR is set between the "Er" state and the "A" state, a read voltage BR is set between the "A" state and the "B" state, and a read voltage CR is set between the "B" state and the "C" state. Further, a read pass voltage VREAD is set as a voltage higher than that in the "C" state.

The read voltages AR, BR, and CR are used to distinguish the "Er" state and the "A" state or more from each other, distinguish the "A" state or lower and the "B" state or more from each other, and distinguish the "B" state or lower and the "C" state from each other, respectively. The memory cell transistor MT with the gate to which the read pass voltage VREAD is applied becomes an ON state, regardless of data to be stored. In the read operation, the semiconductor memory device 1 determines the state where the memory cell transistor MT is distributed, by using the read voltage, so as to confirm read data.

For example, when the data allocation illustrated in FIG. 9 is applied, one page data composed of the lower bits (lower page data) is confirmed by the read operation using the read voltage BR. One page data composed of the upper bits (higher page data) is confirmed by the read operation using the read voltages AR and CR. In a page read operation using multiple read voltages, a logic circuit LC appropriately executes arithmetic processing.

In addition, the number of bits of data stored in one memory cell transistor MT described above is an example, and is not limited to the number described. For example, 1-bit or 3-bits or more data may be stored in the memory cell transistor MT. In the semiconductor memory device 1, the number of threshold voltage distributions formed, the read voltages, the read pass voltage, the verify voltages, etc., may be appropriately set according to the number of bits stored in the memory cell transistor MT.

[1-2] Operation of Semiconductor Memory Device 1

Next, the operation of the semiconductor memory device according to the first embodiment will be described. In the following descriptions, a selected word line WL will be referred to as WLsel, and an unselected line WL will be referred to as WLusel. The select gate line SGD associated with a selected cell unit CU will be referred to as SGDsel, and the select gate line SGD associated with an unselected cell unit CU will be referred to as SGDusel. When a voltage is applied to a wiring such as the word line WL or the select gate line SGD, the driver module 14 applies the voltage to the corresponding wiring via the signal line and the row decoder module 15. It is assumed that the command CMD and the address information ADD received by the semiconductor memory device 1 are transferred to the command register 11 and the address register 12, respectively.

[1-2-1] Outline of Write Operation

Figure 10:
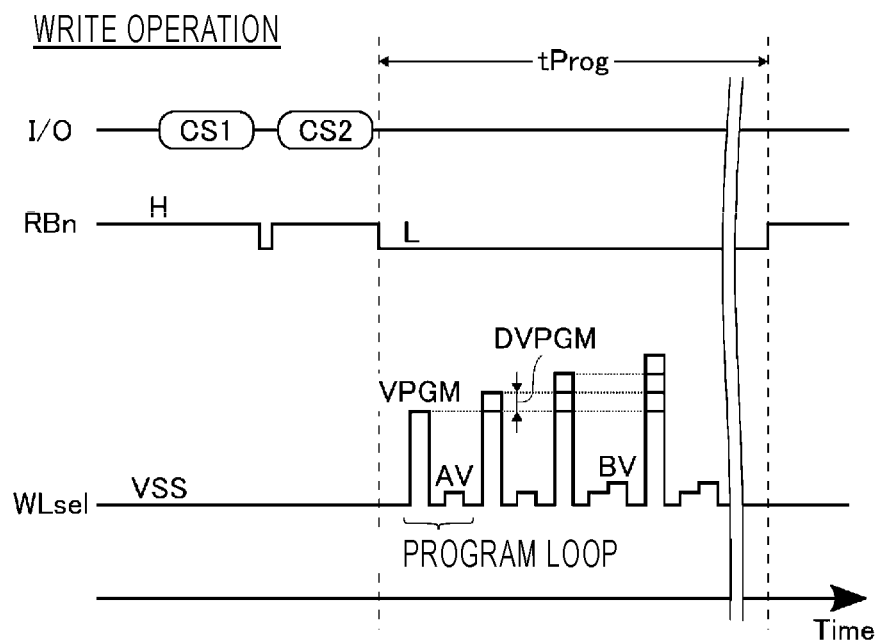
FIG. 10 is a timing chart illustrating an example of a write operation in the semiconductor memory device according to the first embodiment.

First, an outline of the write operation in the semiconductor memory device 1 according to the first embodiment will be described. FIG. 10 represents an example of a command sequence and a timing chart of the write operation in the semiconductor memory device 1 according to the first embodiment. As illustrated in FIG. 10, in the state before the write operation, for example, the ready/busy signal RBn is at the "H" level, and the voltage of the word line WLsel is the VSS.

First, the memory controller 2 transmits a command set CS1 to the semiconductor memory device 1. The command set CS1 includes, for example, a command for instructing the write operation, address information, and lower page write data. The lower page write data is transferred to the plurality of latch circuits XDL in the plurality of sense amplifier units SAU in the sense amplifier module 16.

When the command set CS1 is received, the semiconductor memory device 1 shifts from the ready state to the busy state. Then, the sequencer 13 transfers the lower page write data stored in each latch circuit XDL to, for example, the latch circuit ADL sharing the bus LBUS in the sense amplifier unit SAU. Then, the sequencer 13 causes the semiconductor memory device 1 to shift from the busy state to the ready state.

When it is detected that the semiconductor memory device 1 shifts from the busy state to the ready state after the command set CS1 is transmitted, the memory controller 2 transmits a command set CS2 to the semiconductor memory device 1. The command set CS2 includes, for example, a command for instructing the start of the write operation, address information, and upper page write data. The upper page write data is transferred to the plurality of latch circuits XDL in the plurality of sense amplifier units SAU in the sense amplifier module 16.

When the command set CS2 is received, the semiconductor memory device 1 shifts from the ready state to the busy state. Then, the sequencer 13 starts the write operation based on the command CMD stored in the command register 11, the address information stored in the address register 12, and the write data stored in the sense amplifier module 16. In the write operation, the sequencer 13 repeatedly executes a program loop. The program loop includes, for example, a program operation and a verify operation.

The program operation is an operation to increase the threshold voltage of the memory cell transistor MT. In the program operation, the memory cell transistor MT in a selected cell unit CU is set to a program target or program prohibition, based on write data stored in the sense amplifier unit SAU. Specifically, the memory cell transistor MT is set to a program target when the memory cell transistor MT does not reach the threshold voltage of a state corresponding to write data in the sense amplifier unit SAU (hereinafter, referred to as a write state), and is set to program prohibition when the memory cell transistor MT reaches the threshold voltage of the write state.

In the program operation, a program voltage VPGM is applied to the word line WLsel. The program voltage VPGM is a high voltage capable of increasing the threshold voltage of the memory cell transistor MT. When the program voltage VPGM is applied to the word line WLsel, the threshold voltage of the memory cell transistor MT connected to the word line WLsel and the bit line BL of the program target increases. Meanwhile, the increase of the threshold voltage of the memory cell transistor MT connected to the word line WLsel and the bit line BL of the program prohibition is prevented by, for example, a self-boost technique. When the program operation is ended, the sequencer 13 proceeds to the verify operation.

The verify operation is a read operation to determine whether the memory cell transistor MT in the selected cell unit CU reaches the threshold voltage of the write state. In the verify operation, a verify voltage to be used for the determination of the threshold voltage is determined for each sense amplifier unit SAU. For example, in the verify read of a first program loop, a read operation using the verify voltage AV is executed.

By the verify read, it is determined that the memory cell transistor MT verified to reach the threshold voltage of the write state passes the verify. Then, each sense amplifier unit SAU stores the verify result of the write state in any one of the internal latch circuits. Then, the sequencer 13 refers to the determination result of each sense amplifier unit SAU, counts the number of memory cell transistors MT in which write has been completed, for each write state, and determines whether write of the corresponding state is completed.

The set of program operation and verify operation described above corresponds to one program loop. The program voltage VPGM is stepped up each time the program loop is repeated. That is, the program voltage VPGM applied to the word line WLsel increases according to the number of program loops executed. A step-up amount DVPGM of the program voltage VPGM may be set to any value.

For example, in the repetition of the program loop, when it is detected that the number of memory cell transistors MT that do not pass the verify in the "A" state, the "B" state, and the "C" state falls below a predetermined number, the sequencer 13 ends the write operation and causes the semiconductor memory device 1 to shift from the busy state to the ready state. When the write operation is ended, the two page data is written to the selected cell unit CU. The illustrated tProg corresponds to the time during which the write operation is executed.

[1-2-2] Details of Write Operation

The semiconductor memory device 1 according to the first embodiment may change the type of write operation to be executed, based on the address of the selected cell unit CU.

Details of the write operation of the semiconductor memory device 1 according to the first embodiment will be described below.

Figure 11:
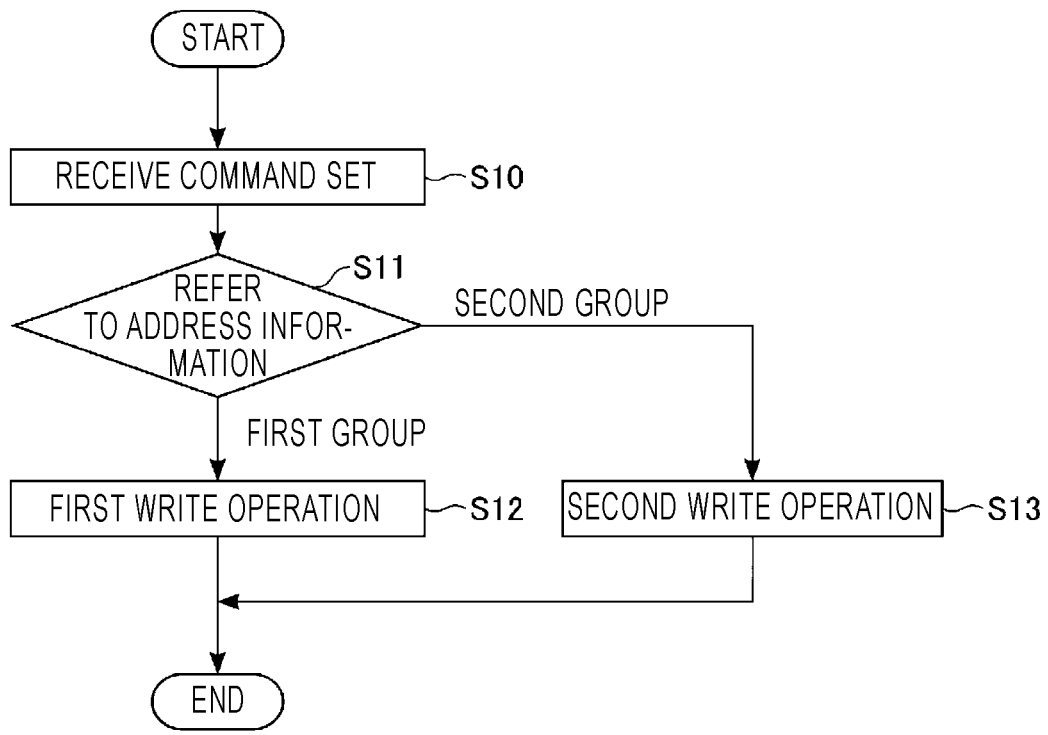
FIG. 11 is a flowchart illustrating an example of the write operation in the semiconductor memory device according to the first embodiment.

FIG. 11 is a flowchart illustrating an example of the write operation of the semiconductor memory device 1 according to the first embodiment, and represents a series of steps from the reception of the write command by the semiconductor memory device 1 until the execution of the write operation. Further, in the present example, the cell unit CU of the first group is associated with the select gate line SGD having a low resistance value, and the cell unit CU of the second group is associated with the select gate line SGD having a high resistance value.

As illustrated in FIG. 11, first, the semiconductor memory device 1 receives the command set for instructing the execution of the write operation (step S10). Then, the sequencer 13 refers to the address information stored in the address register 12 (step S11). Specifically, in step S11, the sequencer 13 determines whether the cell unit CU selected based on the address information is in the first group or the second group. When it is determined that the cell unit CU is in the first group, the sequencer 13 executes the first write operation (step S12). Meanwhile, when it is determined that the cell unit CU is in the second group, the sequencer 13 executes the second write operation (step S13).

As described above, the semiconductor memory device 1 according to the first embodiment writes data to the memory cell transistor MT in the selected cell unit CU, by executing the first write operation or the second write operation. A discharge time in the program operation is set differently for the first write operation and the second write operation. Details of the first write operation and the second write operation will be described below.

Figure 12:
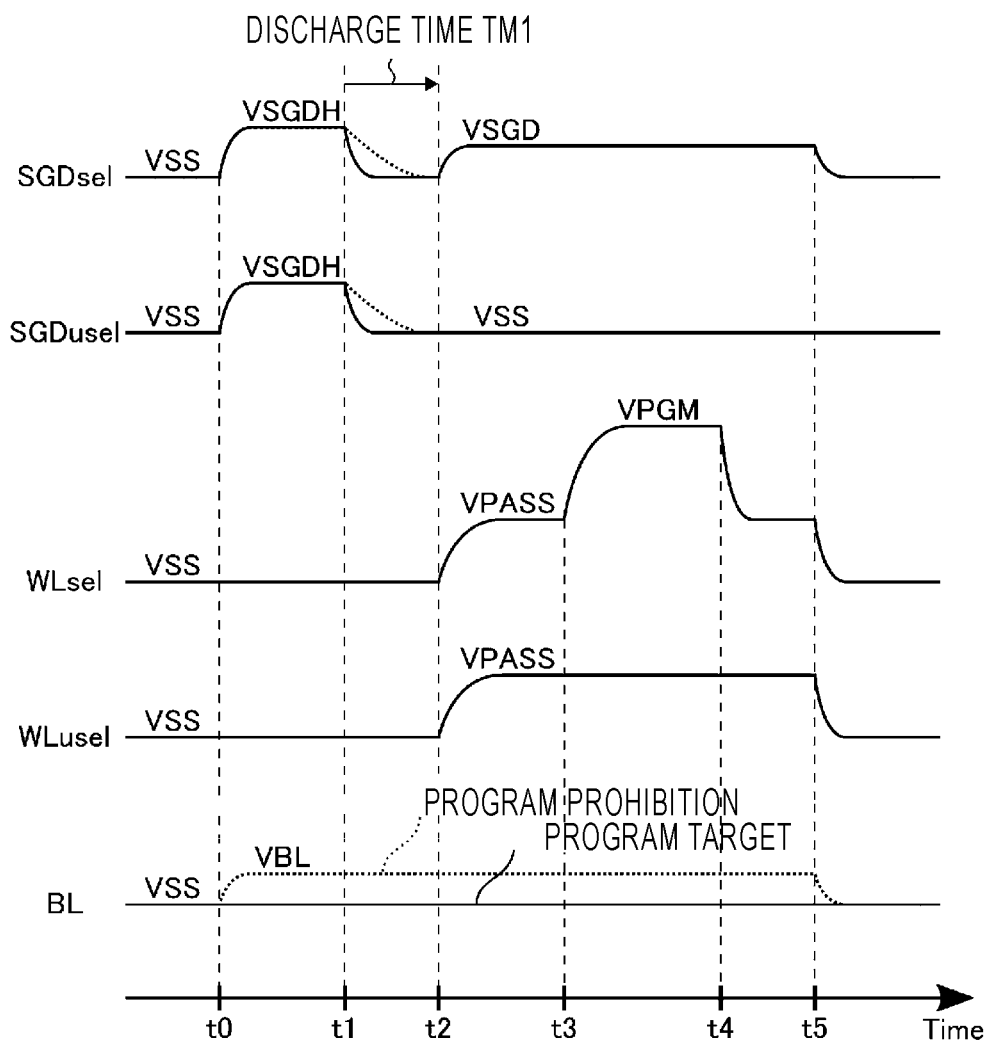
FIG. 12 is a timing chart illustrating an example of a program operation of a first write operation in the semiconductor memory device according to the first embodiment.

FIG. 12 illustrates an example of a timing chart of the program operation in the first write operation of the semiconductor memory device 1 according to the first embodiment. FIG. 12 illustrates the voltage of each of the select gate lines SGDsel and SGDusel, the word lines WLsel and WLusel, and the bit line BL. Further, in the voltage of the select gate line SGD, the solid line corresponds to an ideal voltage (voltage of the signal line SGDD), and the dashed line corresponds to an actual voltage change.

As illustrated in FIG. 12, the voltage of each of the select gate lines SGDsel and SGDusel, the word lines WLsel and WLusel, and the bit line BL before the program operation is, for example, the VSS. When the program operation is started, the sequencer 13 controls the driver module 14 at each of timings t0 to t5, to apply voltages to the various wirings as described below.

At the timing t0, a voltage VSGDH is applied to each of the select gate lines SGDsel and SGDusel, and a voltage VBL is applied to the bit line BL of the program prohibition. Each of the VSGDH and VBL is higher than the ground voltage VSS. Each select transistor ST1 becomes the ON state when the VSGDH is applied to the gate thereof. At this time, in the NAND string NS connected to the bit line BL of the program target, electrons remaining in the channel are removed. Meanwhile, the channel voltage of the NAND string NS connected to the bit line BL of the program prohibition increases based on the voltage applied to the bit line BL.

At the timing t1, the VSS is applied to each of the select gate lines SGDsel and SGDusel, and the voltage of each of the select gate lines SGDsel and SGDusel decreases. Further, the voltage of each of the select gate lines SGDsel and SGDusel decreases while being delayed relative to the signal line SGDD. When the voltage of each of the select gate lines SGDsel and SGDusel decreases, each select transistor ST1 becomes an OFF state. At this time, the channel voltage of the NAND string NS connected to the bit line BL of the program target is, for example, the VSS. Meanwhile, the channel voltage of the NAND string NS connected to the bit line BL of the program prohibition maintains the increased state based on the VBL.

The above-described operation between the timings t0 and t1 is also called a precharge operation. Then, the sequencer 13 starts the operation of the timing t2 after the voltage of each of the select gate lines SGDsel and SGDusel decreases to the VSS. In other words, in the semiconductor memory device 1 according to the first embodiment, the start timing of the operation of the timing t2 is set based on the timing when the discharge of each of the select gate lines SGDsel and SGDusel is completed. Hereinafter, the time between the timings t1 and t2 will be referred to as the discharge time after the precharge operation. Further, the discharge time after the precharge operation in the first write operation will be referred to as TM1.

At the timing t2, the voltage VSGD is applied to the select gate line SGDsel, and a voltage VPASS is applied to each of the word lines WLsel and WLusel. The VSGD is higher than the VSS and lower than the VSGDH, and the VPASS is higher than the VSGD. At this time, the select transistor ST1 connected to the bit line BL of the program target and applied with the VSGD at the gate thereof becomes the ON state. Meanwhile, the select transistor ST1 connected to the bit line BL of the program prohibition and applied with the VSGD at the gate thereof and the select transistor ST1 applied with the VSS at the gate thereof become the OFF state, and the channel of the corresponding NAND string NS becomes a floating state.

In addition, the channel voltage of the NAND string NS varies according to the coupling with the word line WL. Specifically, the channel voltage of the NAND string NS that has become the floating state increases with the application of the VPASS to each of the word lines WLsel and WLusel. Hereinafter, this operation will be referred to as the self-boost. Meanwhile, the increase of the channel voltage of the NAND string NS in which the select transistor ST1 is in the OFF state is prevented by the voltage applied to the bit line BL.

At the timing t3, the program voltage VPGM is applied to the word line WLsel. When the VPGM is applied to the word line WLsel, electrons are injected to the charge storage layer of the memory cell transistor MT connected to the bit line BL of the program target and also connected to the select transistor ST1 with the gate to which the VSGD is applied, based on the voltage difference between the channel and the control gate. When electrons are injected to the charge storage layer, the threshold voltage of the memory cell transistor MT increases. Meanwhile, the threshold voltages of the memory cell transistors MT in the other NAND strings NS are prevented from being increased, since the voltage difference between the channel and the control gate becomes small by the self-boost.

At the timing t4, the VPASS is applied to the word line WLsel, and the voltage of the word line WLsel decreases. In the program operation, the extent of the increase of the threshold voltage in the memory cell transistor MT of the write target is based on, for example, the voltage value of the VPGM and the application time of the VPGM (i.e., the time between the timings t3 and t4).

At the timing t5, the VSS is applied to each of the select gate line SGDsel, the word lines WLsel and WLusel, and the bit line BL of the program prohibition, and the voltage of each of the select gate line SGDsel, the word lines WLsel and WLusel, and the bit line BL of the program prohibition decreases. At this time, the channel voltage of the NAND string NS in the floating state also decreases with the decrease of the voltage of each of the word lines WLsel and WLusel. As a result, the voltage of each wiring returns to the state before the start of the program operation, and the sequencer 13 ends one program operation in the first write operation.

Figure 13:
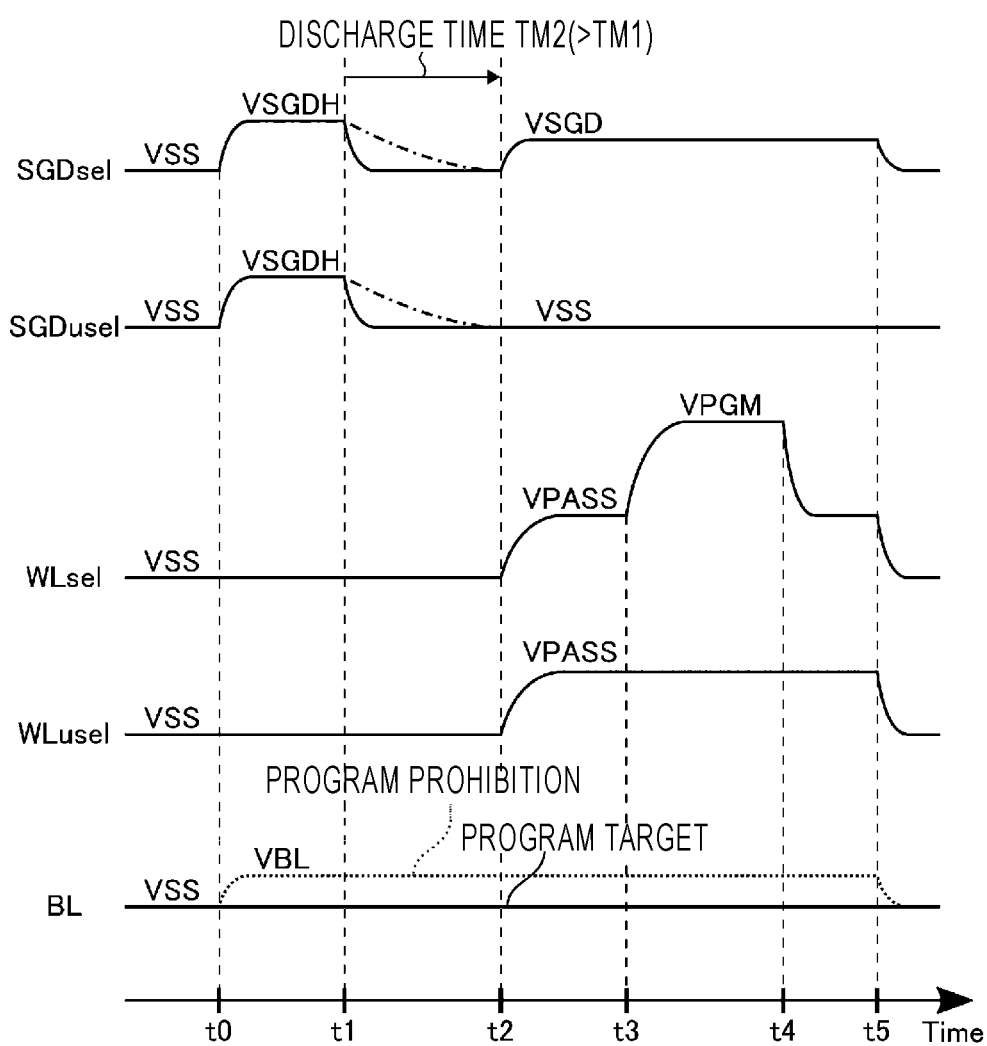
FIG. 13 is a timing chart illustrating an example of a program operation of a second write operation in the semiconductor memory device according to the first embodiment.

FIG. 13 represents an example of a timing chart of the program operation in the second write operation of the semiconductor memory device 1 according to the first embodiment. FIG. 13 illustrates the voltages of the same wirings as those in FIG. 12. In addition, in the voltage of the select gate line SGD, the solid line corresponds to an ideal voltage (voltage of the signal line SGDD), and the alternate long and short dash line corresponds to an actual voltage change.

As illustrated in FIG. 13, in the second write operation, the effective time required for the decrease of the voltage of each of the select gate lines SGDsel and SGDusel by the operation of the timing t1 is longer than that in the first write operation. This characteristic is based on the fact that the resistance value of the select gate lines SGD of the second group to which the second write operation is applied is higher than the resistance value of the select gate line SGD of the first group to which the first write operation is applied.

In addition, the program operation of the second write operation is different from the program operation of the first write operation, in the operation corresponding to the discharge time after the precharge operation. Specifically, the start timing of the operation of the timing t2 in the second write operation is set based on the timing when the discharge of each of the select gate lines SGDsel and SGDusel is completed, as in the first write operation. Thus, a discharge time TM2 after the precharge operation in the second write operation is set to be longer than the discharge time TM1 after the precharge operation in the first write operation.

The other operations in the program operation of the second write operation are the same as, for example, those in the program operation of the first write operation. The processing time of the second write operation becomes longer than the processing time of the first write operation, based on the difference in length of the discharge time of the program operation.

In addition, the setting of the discharge time after the precharge operation in the first and second write operations described above is merely an example. When the difference in resistance value of the select gate line SGD between the string units SU is small, the same setting may be applied to the discharge time after the precharge operation. The setting of the discharge time after the precharge operation is stored in an area of the semiconductor memory device 1 that may be referred to by the sequencer 13. For example, the setting of the discharge time after the precharge operation may be stored in the memory cell array 10, and may be read when the semiconductor memory device 1 is started.

[1-3] Effects of First Embodiment

According to the semiconductor memory device 1 of the first embodiment described above, it is possible to prevent the generation of error bits and reduce the total time for the write operation. Details of the effects of the semiconductor memory device 1 according to the first embodiment will be described below.

When the program voltage is applied in the write operation of the semiconductor memory device, it is preferable that the channel voltage of the memory cell of the program prohibition sufficiently increases by the self-boost. The sufficient self-boost may prevent the fluctuation of the threshold voltage of the memory cell in which write has been completed, and may prevent the expansion of the upper skirt of the threshold voltage distribution of each state.

Meanwhile, when the self-boost is insufficient, the voltage difference between the control gate and the channel of the memory cell of the program prohibition becomes large. In the memory cell of the state with a low threshold voltage (e.g., the "Er" state), the threshold voltage may increase even by the low program voltage. Thus, the threshold voltage of the memory cell of the state with a low threshold voltage may increase by the program operation in a case where the self-boost is insufficient, and thus, the upper skirt of the threshold voltage distribution of the corresponding state may be expanded. The expansion of the threshold voltage distribution may cause the generation of error bits.

As a countermeasure, it may be conceived to execute the precharge operation at the time of the program operation. When the precharge operation is executed, the increase of the channel voltage by the coupling is performed based on a channel voltage increased in advance. That is, the channel voltage when the precharge operation is executed becomes higher than the channel voltage when the precharge operation is not executed. Accordingly, the precharge operation may prevent the fluctuation of the threshold voltage of the memory cell in which write has been completed, and may prevent the expansion of the threshold voltage distribution of each state.

In the precharge operation, in a state where the channel voltage of the memory cell of the program prohibition is increased in advance, the channel of the NAND string NS including the memory cell is controlled to become the floating state. Specifically, the select transistor ST1 connected to the memory cell of the program prohibition is controlled to become the OFF state, before the VPASS is applied to the word lines WLsel and WLusel. When the shift of the select transistor ST1 to the OFF state is delayed, the threshold voltage distribution of the memory cell of the program prohibition may be expanded by the insufficient self-boost. That is, error bits may increase.

In addition, in a semiconductor memory device in which memory cells are stacked in a three-dimensional form, for example, the slit SHE that divides the select gate line SGD may be disposed between adjacent slits SLT. The slits SLT and SHE are formed by, for example, different manufacturing processes. Further, the slit SHE is positioned at the central portion between the adjacent slits SLT. In this case, the resistance values of the two select gate lines SGD divided by the slit SHE become substantially equal to each other.

However, it may be considered that the positions of the slits SLT and SHE are affected by manufacturing variations. When the slit SHE shifts to the side of one of the adjacent slits SLT, two types of SGD including an SGD with a low resistance value and an SGD with a high resistance value may be formed as the select gate lines SGD divided by the slit SHE. When the resistance values of the select gate lines SGD are different from each other, the control characteristic of the select gate line SGD may change for each string unit SU.

Figure 14:
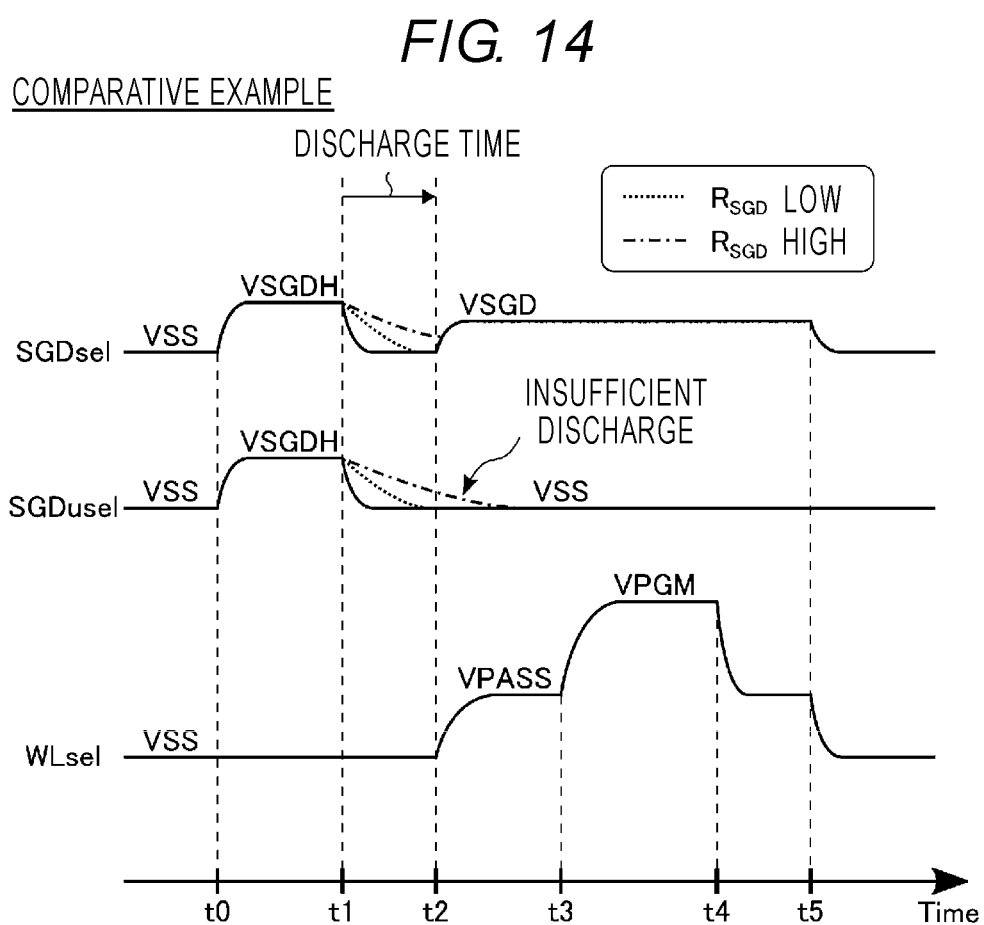
FIG. 14 is a timing chart illustrating an example of a program operation of a write operation in a semiconductor memory device according to a comparative example of the first embodiment.

Hereinafter, descriptions will be made on the characteristic of the precharge operation described above and the operation of the semiconductor memory device which is related to the difference in resistance value of the select gate line SGD, using a comparative example. FIG. 14 represents an example of a timing chart of a program operation in a write operation of a semiconductor memory device according to a comparative example of the first embodiment. FIG. 14 illustrates a voltage of each of the select gate lines SGDsel and SGDusel and the word line WLsel. In addition, in the voltage of the select gate line SGD, the solid line corresponds to an ideal voltage (voltage of the signal line SGDD), the dashed line corresponds to a voltage change in a case where the resistance value RSGD of the select gate line SGD is low, and the alternate long and short dash line corresponds to a voltage change in a case where the RSGD is high.

As illustrated in FIG. 14, the processing contents at timings t0 to t5 of the program operation in the comparative example are the same as those at the timings t0 to t5 of the program operation in the first write operation, respectively. Further, the processings at the timings t0 to t5 of the program operation in the comparative example are executed at the same timings as those in the program operation of the first write operation, regardless of the address of a selected cell unit CU.

Here, descriptions will be made on a case where the discharge time of the precharge operation in the comparative example is optimized for the operation characteristic in a case where the RSGD is low. When the RSGD is low, for example, the discharge time is set to be short, and thus, the processing time for each program loop becomes short. That is, the processing time in one write operation may be reduced. Meanwhile, in the program operation in a case where a string unit SU with a high RSGD is selected, the operation of the timing t2 is started before the voltage of the select gate line SGDusel becomes the VSS. That is, the charge of the word line WL may be started before the select transistor ST1 connected to the memory cell of the program prohibition becomes the OFF state (insufficient discharge). In this case, the self-boost of the memory cell of the program prohibition becomes insufficient, and error bits may increase.

For example, in the comparative example, when the discharge time after the precharge operation is optimized for the operation characteristic in a case where the RSGD is high, the concern of the insufficient discharge after the precharge operation may be eliminated. However, when the RSGD is high, the setting of long discharge time is fixed, and hence, the processing time for each program loop becomes long. That is, the processing time in one write operation becomes longer when the discharge time of the precharge operation is optimized for the case where the RSGD is high, than that when the discharge time of the precharge operation is optimized for the operation characteristic in a case where the RSGD is low. Thus, in the comparative example, it is difficult to achieve both the reduction of the processing time of the write operation and the reduction of error bits.

Meanwhile, the semiconductor memory device 1 according to the first embodiment changes the discharge time after the precharge operation for each address selected in the write operation. Then, the string units SU are classified into groups based on the pre-measured characteristics of the select gate lines SGD, and the discharge time after the precharge operation is set to an optimum time for each set group.

Specifically, the semiconductor memory device 1 executes the first write operation in which the discharge time after the precharge operation is short, when a group having the low resistance value RSGD of the select gate line SGD is selected. Meanwhile, when a group having the high resistance value RSGD of the select gate line SGD is selected, the semiconductor memory device 1 executes the second write operation in which the discharge time after the precharge operation is long. In any case, the operation timing at the timing t2 after the precharge operation is set to be subsequent to the timing when it is estimated that the discharge of the select gate line SGDusel is completed.

Thus, in the program operation of the semiconductor memory device 1 according to the first embodiment, it is expected that the select transistor ST1 is highly likely to become the OFF state before the VPASS is applied to the word line WL. That is, in the program operation, the semiconductor memory device 1 may more reliably make the channel of the memory cell of the program prohibition in the floating state, so that the sufficient self-boost may be implemented. Accordingly, the semiconductor memory device 1 according to the first embodiment may prevent the generation of error bits.

Further, in the semiconductor memory device 1 according to the first embodiment, the discharge time after the precharge operation is set, for each group, to become short within a range in which the generation of error bits may be suppressed. That is, the semiconductor memory device 1 may proceed with the write operation at a high speed in the allowable range while preventing the generation of error bits. As a result, the semiconductor memory device 1 according to the first embodiment may also reduce the total time for the write operation.

[2] Second Embodiment

A semiconductor memory device 1 according to a second embodiment is a modification of the program operation in each of the first write operation and the second write operation described in the first embodiment. Hereinafter, differences of the semiconductor memory device 1 according to the second embodiment from the first embodiment will be described.

[2-1] Write Operation

Hereinafter, the first write operation and the second write operation in the semiconductor memory device 1 according to the second embodiment will be described in this order. Further, in the write operation of the semiconductor memory device 1 according to the second embodiment, as in the first embodiment, it is assumed that the cell unit CU of the first group is associated with the select gate line SGD with a low resistance value, and the cell unit CU of the second group is associated with a select gate line SGD with a high resistance value. Further, it is assumed that the first write operation is executed when the cell unit CU of the first group is selected, and the second write operation is executed when the cell unit CU of the second group is selected.

Figure 15:
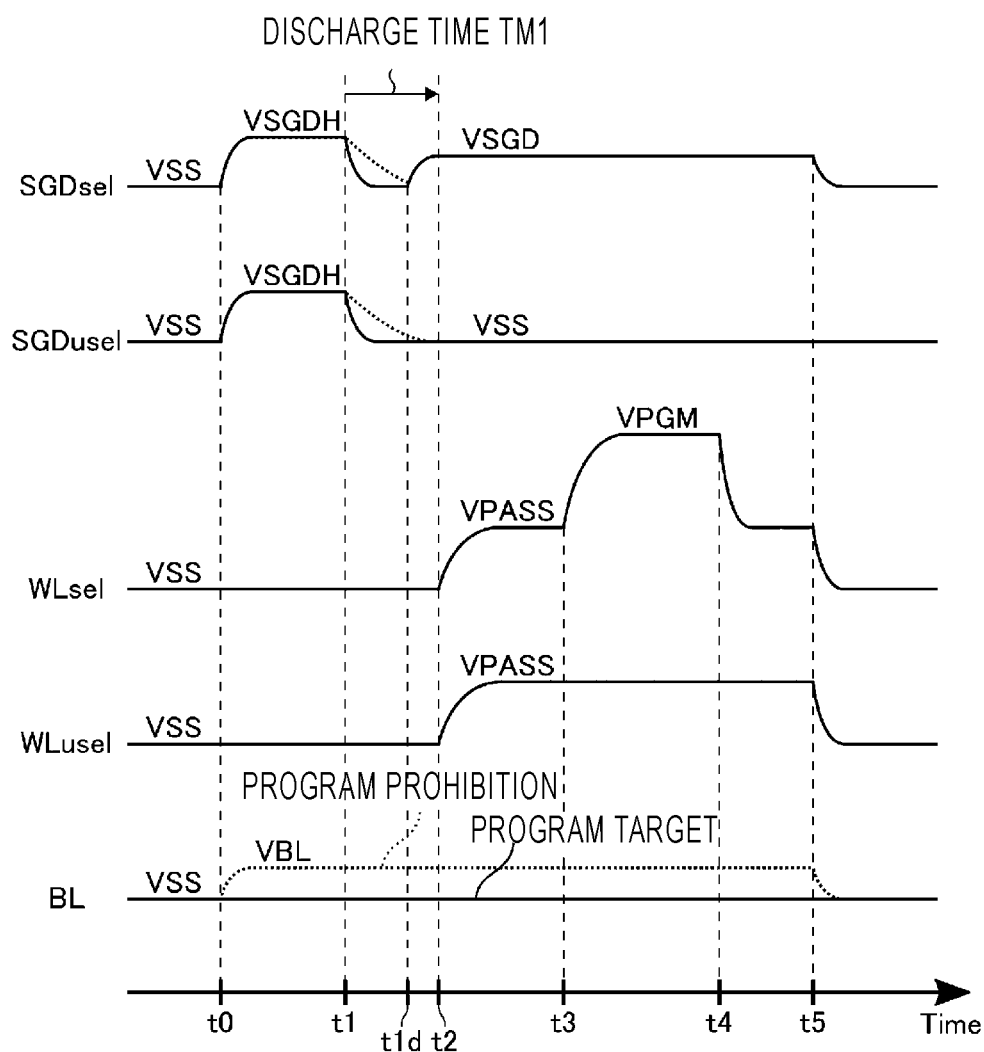
FIG. 15 is a timing chart illustrating an example of a program operation of a first write operation in a semiconductor memory device according to a second embodiment.

FIG. 15 represents an example of a timing chart of the program operation in the first write operation of the semiconductor memory device 1 according to the second embodiment. FIG. 15 illustrates the voltages of the same wirings as those in FIG. 12 referred to in the first embodiment. As illustrated in FIG. 15, the program operation of the first write operation in the second embodiment is different from the program operation of the first write operation in the first embodiment, in the operation timings of the select gate lines SGDsel and SGDusel and the operation timings of the word lines WLsel and WLusel after the precharge operation.

Specifically, in the first write operation of the second embodiment, the timing when the voltage VSGD is applied to the select gate line SGDsel after the precharge operation is set to a timing t1d between the timings t1 and t2. Meanwhile, the timing when the voltage VPASS is applied to the word lines WLsel and WLusel after the precharge operation is set to the timing t2, as in the first embodiment.

At the timing t1d, the VSGD is applied to the select gate line SGDsel before the discharge is completed. Then, the voltage of the select gate line SGDsel reaches the VSGD, for example, before the timing t2. Then, in the second embodiment, the sequencer 13 starts the operation of the timing t2 after the voltage of the select gate line SGDusel decreases to the VSS. That is, in the semiconductor memory device 1 according to the second embodiment, the start timing of the operation of the timing t2 is set based on the timing when the discharge of the select gate line SGDusel is completed, as in the first embodiment. The other operations of the first write operation in the second embodiment are the same as those of the first write operation in the first embodiment.

Figure 16:
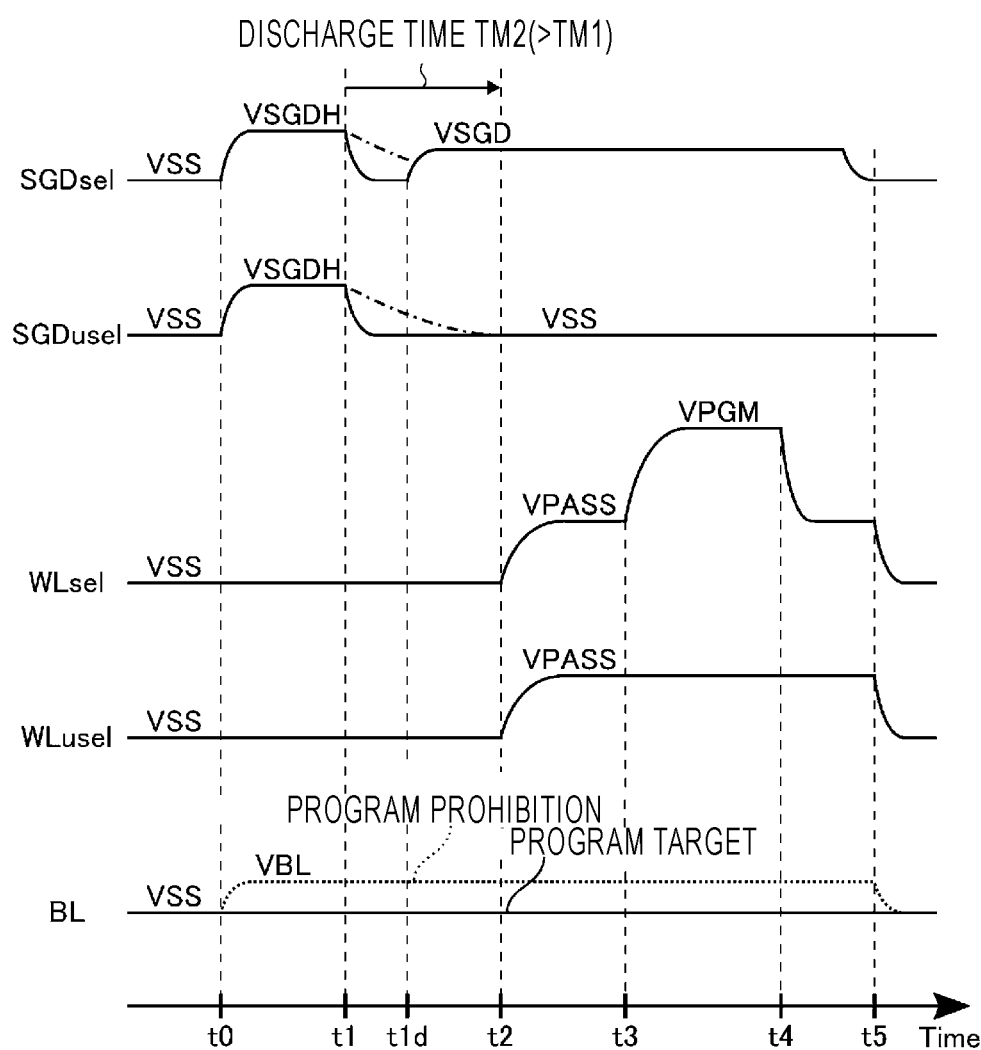
FIG. 16 is a timing chart illustrating an example of a program operation of a second write operation in the semiconductor memory device according to the second embodiment.

FIG. 16 represents an example of a timing chart of the program operation in the second write operation of the semiconductor memory device 1 according to the second embodiment. FIG. 16 illustrates the voltages of the same wirings as those in FIG. 12 referred to in the first embodiment. As illustrated in FIG. 16, the program operation of the second write operation in the second embodiment is different from the program operation of the first write operation in the second embodiment, in the operation timings of the word lines WLsel and WLusel.

Specifically, in the second write operation, the effective time required for the decrease of the voltage of the select gate line SGDusel by the operation of the timing t1 is longer than that in the first write operation. As in the first embodiment, this characteristic is based on the fact that the resistance value of the select gate line SGD of the second group to which the second write operation is applied is higher than the resistance value of the select gate line SGD of the first group to which the first write operation is applied.

Then, the start timing of the operation of the timing t2 in the second write operation is set based on the timing when the discharge of the select gate line SGDusel is completed, as in the first write operation. Thus, in the second embodiment, the discharge time TM2 after the precharge operation in the second write operation is set to be longer than the discharge time TM1 after the precharge operation in the first write operation. The other operations of the second write operation in the second embodiment are the same as those of the first write operation in the second embodiment.

In the operation of the second embodiment described above, the timing t1d of the first write operation and the timing t1d of the second write operation indicate the same timing. That is, in the program operation of the second embodiment, the operation timing of the timing t1d when the VSGD is applied to the select gate line SGDsel is the same. Meanwhile, in the program operation of the second embodiment, the operation timing of the timing t2 when the VPASS is applied to the word lines WLsel and WLusel is set based on the timing when the discharge of the select gate line SGDusel is completed.

[2-2] Effects of Second Embodiment

As described above, in the semiconductor memory device 1 according to the second embodiment, the timing when the VSGD is applied to the select gate line SGDsel after the precharge operation is fixed, regardless of the selected address. Meanwhile, the timing when the VPASS is applied to the word line WL after the precharge operation is set based on the discharge time of the select gate line SGDusel, as in the first embodiment.

In this case as well, similarly to the first embodiment, the semiconductor memory device 1 according to the second embodiment may prevent the generation of error bits and reduce the total time for the write operation. In order to obtain the effects described in the first embodiment, at least the relationship between the timing t1 when the discharge of the select gate line SGDusel is started and the timing t2 when the charge of the word line WL is started after the precharge operation may be set based on the characteristic of the select gate line SGD.

[3] Other Modification, Etc

In the embodiments described above, a case where the discharge time after the precharge operation is set such that the discharge of the select gate line SGDusel is completed has been described. However, the present disclosure is not limited thereto. At the timing t2 after the precharge operation, the voltage of the select gate line SGDusel only has to decrease to the voltage at which the select transistor ST1 connected to at least the corresponding select gate line SGDusel becomes the OFF state. Thus, the discharge time after the precharge may be set based on the timing when the voltage of the select gate line SGDusel falls below the voltage at which the select transistor ST1 becomes the OFF state.

In the embodiments described above, two or more slits SHE may be arranged between adjacent slits SLT. The number of string units SU formed between adjacent slits SLT varies based on the number of slits SHE arranged between the adjacent slits SLT. When two or more slits SHE are arranged between adjacent slits SLT, the resistance values of the select gate lines SGD arranged between the adjacent slits SLT may be classified into three types.

Figure 17:
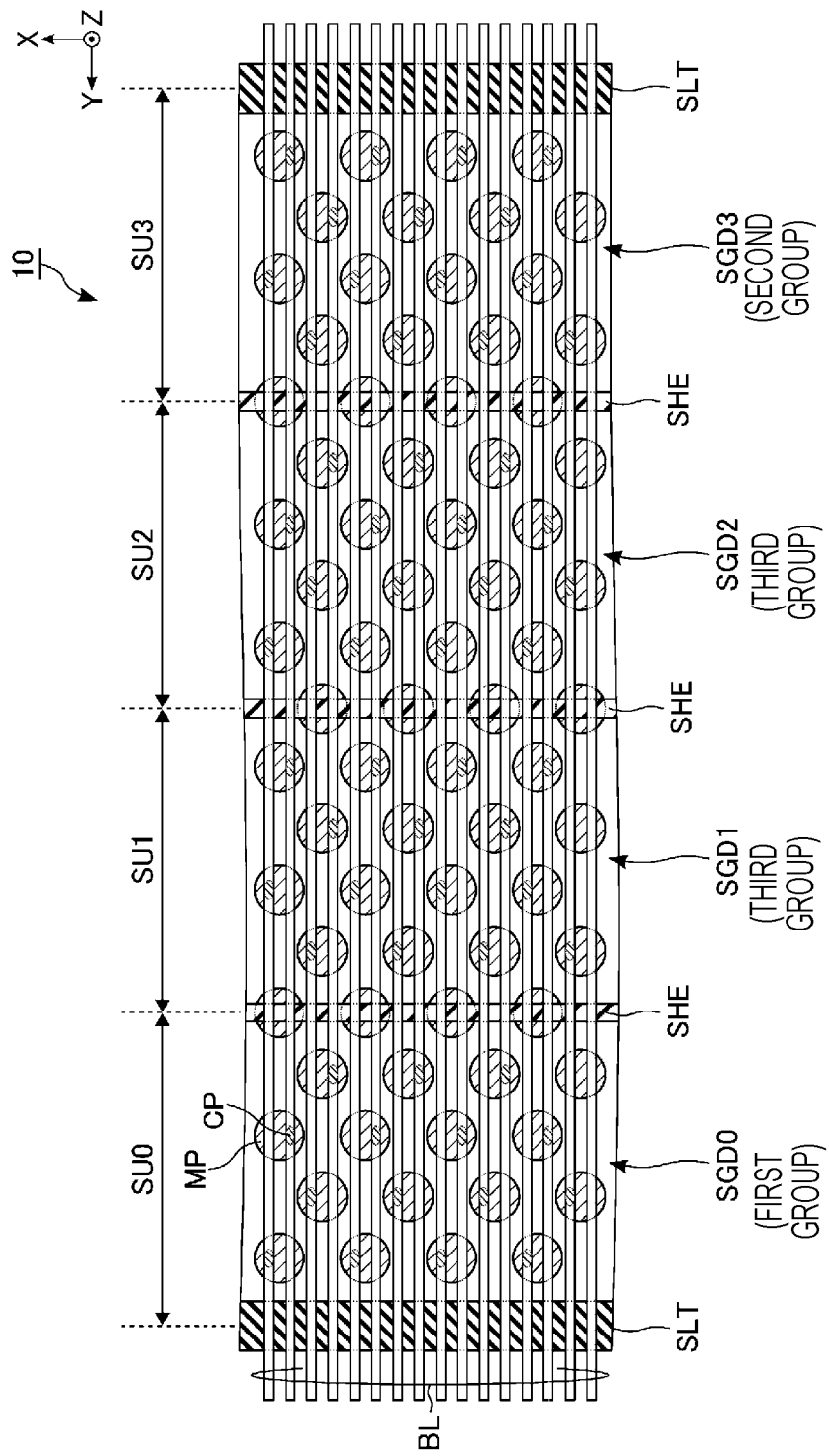
FIG. 17 is a planar view illustrating an example of a planar layout of a memory cell array provided in a semiconductor memory device according to a modification of the first embodiment.

FIG. 17 is an example of a planar layout of a memory cell array provided in a semiconductor memory device 1 according to a modification of the first embodiment, and represents the same area as that in FIG. 6 referred to in the first embodiment. As illustrated in FIG. 17, in the semiconductor memory device 1 according to the modification of the first embodiment, three slits SHE are arranged between adjacent slits SLT.

The widths of the select gate lines SGD between adjacent slits SHE are based on the design of a mask. That is, the resistance values of the select gate lines SGD disposed between the adjacent slits SHE may be substantially constant. Meanwhile, the width of the select gate line SGD adjacent to the slit SLT is affected by manufacturing variations as described in the first embodiment. Thus, there may occur a difference in resistance value between the select gate lines SGD0 and SGD3 adjacent to the slit SLT. Further, since the width of the select gate line SGD adjacent to the slit SLT is designed to be wide in consideration of the process margin, the width of the select gate line SGD adjacent to the slit SLT may be wider than the width of the select gate line SGD sandwiched between the slits SHE.

As described above, in the modification of the first embodiment, for example, the resistance values of the select gate line SGD0, the set of select gate lines SGD1 and SGD2, and the select gate line SGD3 may be different from each other. Thus, in the modification of the first embodiment, for example, the string unit SU0 is classified into a first group, the string unit SU3 is classified into a second group, and the string units SU1 and SU2 are classified into a third group.

Figures 18, 19:
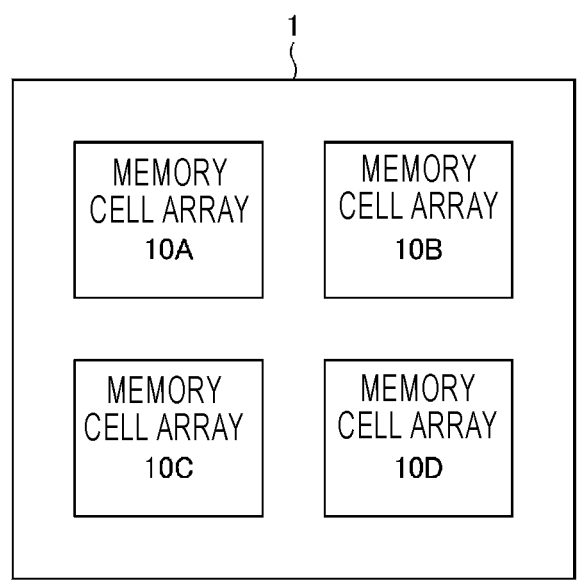
FIG. 18 is a table illustrating an example of settings of the write operation in the semiconductor memory device according to the modification of the first embodiment.
FIG. 19 is a planar view illustrating an example of a planar layout of the semiconductor memory device according to the modification of the first embodiment.

FIG. 18 represents an example of the setting of the write operation in the semiconductor memory device 1 according to the modification of the first embodiment, and illustrates a relationship between the groups of the string units SU and the settings of the discharge time. As illustrated in FIG. 18, for example, Settings 1 to 3 are applied to the string units SU of the first to third groups, respectively. Since Settings 1 to 3 have different settings of discharge time, for example, the length of the time period between the timings t1 and t2 illustrated in FIG. 12 becomes different. An appropriate numerical value calculated through a test process is applied to the discharge time of each setting.

In addition, the grouping of the string units SU when two or more slits SHE are arranged between adjacent slits SLT may be appropriately set according to the number of slits SHE. Further, in the embodiments described above, a case where the same grouping is applied to each block BLK in the semiconductor memory device 1 has been described. However, a different grouping may be applied to each block BLK or a different setting of discharge time may be applied to each block BLK. The effects described above in the embodiments may be obtained when different settings of discharge time are applied in the program operations of the write operations in which different addresses are selected.

In the embodiments described above, a case where the string units SU in a block BLK are grouped and a different setting of discharge time is applied for each group has been described. However, as for the grouping method, other methods may be applied. For example, the grouping of the string units SU may be shared among blocks BLK or a different group may be set for each block BLK. Further, the semiconductor memory device 1 may include a plurality of memory cell arrays 10. In this case, a different group may be set for each memory cell array 10.

FIG. 19 represents an example of a planar layout of the semiconductor memory device 1 according to the modification of the first embodiment. As illustrated in FIG. 19, for example, the semiconductor memory device 1 includes a plurality of memory cell arrays 10A, 10B, 10C, and 10D. The shifting manner of the pattern of the slit SHE may be different according to the position of a chip. Thus, the semiconductor memory device 1 sets different groups for the plurality of memory cell arrays 10A to 10D, so that it is possible to prevent the generation of error bits and reduce the total time for the write operation, with the relatively higher accuracy.

In the embodiments described above, the memory pillar MP may have a structure in which a plurality of pillars are connected to each other in the Z direction. For example, the memory pillar MP may have a structure in which a pillar that penetrates the conductor layer 24 (select gate line SGD) and a pillar that penetrates the plurality of conductor layers 23 (word lines WL) are connected to each other. In addition, the memory pillar MP may have a structure in which a plurality of pillars that penetrate the plurality of conductor layers 23, respectively, are connected to each other in the Z direction.

In the embodiments described above, a case where the semiconductor memory device 1 has a structure in which circuits such as the sense amplifier module 16 are disposed below the memory cell array 10 has been described. However, the present disclosure is not limited thereto. For example, the semiconductor memory device 1 may have a structure in which the memory cell array 10 is provided on a semiconductor substrate. In addition, the semiconductor memory device 1 may have a structure in which a chip provided with the sense amplifier module 16, etc., and a chip provided with the memory cell array 10 are bonded to each other.

The timing charts used for the descriptions of the read operation in the embodiments above are merely examples. For example, at each timing, the timing when the voltage of each of signals and wirings is controlled may be shifted. In the program operation, at least, the order of the operations at the respective timings does not have to be changed.

In the descriptions herein, the voltage of "H" level is a voltage at which the N-type MOS transistor with the gate to which the voltage is applied becomes the ON state and the P-type MOS transistor with the gate to which the voltage is applied becomes the OFF state. The voltage of "L" level is a voltage at which the N-type MOS transistor with the gate to which the voltage is applied becomes the OFF state and the P-type MOS transistor with the gate to which the voltage is applied becomes the ON state. The "one end of a transistor" indicates the drain or source of the MOS transistor. The "other end of the transistor" indicates the source or drain of the MOS transistor.

In the descriptions herein, the "connection" indicates an electrical connection, and does not exclude, for example, a connection via another element. The "OFF state" indicates that a voltage lower than the threshold voltage of a corresponding transistor is applied to the gate of the transistor, and does not exclude a case where a minute current such as a leakage current of the transistor flows. The "timing" corresponds to the start timing of an application of a voltage. For example, the description "ground voltage VSS is applied to the select gate line SGD at the timing t1" corresponds to the start of application of the voltage VSS to the select gate line SGD at the timing t1, and includes a time period when the voltage of the select gate line SGD changes based on the voltage of the signal line SGDD. The "columnar shape" indicates a structure provided in a hole formed in the manufacturing process of the semiconductor memory device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell;
   a second memory cell;
   a word line connected to the first memory cell and the second memory cell;
   a first bit line connected to the first memory cell;
   a second bit line connected to the second memory cell;
   a first select transistor connected between the first memory cell and the first bit line;
   a second select transistor connected between the second memory cell and the second bit line;
   a first select gate line connected to the first select transistor;
   a second select gate line connected to the second select transistor;
   a controller configured to execute a write operation that includes a program operation, wherein in the program operation, the controller is configured to apply a first voltage to the first select gate line and the second select gate line at a first timing, apply a second voltage lower than the first voltage to the first select gate line and the second select gate line at a second timing after the first timing, apply a third voltage higher than the second voltage to the word line at a third timing after the second timing, apply a fourth voltage to the first select gate line at a fourth timing after the second timing when the first memory cell is selected or to the second select gate line at the fourth timing when the second memory cell is selected, the fourth voltage between the first voltage and the second voltage, and apply a fifth voltage higher than the third voltage to the word line at a fifth timing after the third timing, and in the program operation when the first memory cell is selected, a first time period being a difference between the second and third timings, and in the program operation when the second memory cell is selected, a second time period being a difference between the second and third timings, wherein the second time period is different from the first time period;

a substrate;

a first conductor layer provided in a first layer above the substrate and configured to function as the word line;

a second conductor layer in a second layer above the first layer, and configured to function as the first select gate line;

a third conductor layer provided in the second layer and separate from the second conductor layer, and configured to function as the second select gate line;

a first semiconductor layer penetrating the first conductor layer and the second conductor layer; and a second semiconductor layer penetrating the first conductor layer and the third conductor layer;

wherein a first intersection portion of the first conductor layer and the second semiconductor layer functions as the first memory cell, a second intersection portion of the second conductor layer and the first semiconductor layer functions as the first select transistor, a third intersection portion of the first conductor layer and the second semiconductor layer functions as the second memory cell, and a fourth intersection portion of the third conductor layer and the second semiconductor layer functions as the second select transistor, wherein a resistance value of the second conductor layer is lower than a resistance value of the third conductor layer, and the first time period is shorter than the second time period.

2. The semiconductor memory device according to claim 1, wherein the third timing and the fourth timing are the same.

3. The semiconductor memory device according to claim 1, wherein the fourth timing precedes the third timing.

4. The semiconductor memory device according to claim 1, wherein while applying the first voltage to the first select gate line and the second select gate line, the controller is configured to apply a sixth voltage to the first bit line and a seventh voltage higher than the sixth voltage to the second bit line when the first memory cell is selected, and apply the seventh voltage to the first bit line and the sixth voltage to the second bit line when the second memory cell is selected.

5. The semiconductor memory device according to claim 1, wherein while applying the third voltage to the word line, the controller is configured to apply a sixth voltage to the first bit line and a seventh voltage higher than the sixth voltage to the second bit line when the first memory cell is selected, and apply the seventh voltage to the first bit line and the sixth voltage to the second bit line when the second memory cell is selected.

6. The semiconductor memory device according to claim 1, wherein while applying the fifth voltage to the word line, the controller is configured to apply the fourth voltage to the first select gate line when the first memory cell is selected, and apply the fourth voltage to the second select gate line when the second memory cell is selected.

7. The semiconductor memory device according to claim 1, wherein in the program operation when the first memory cell is selected, a channel of the first memory cell becomes a floating state when the fifth voltage is applied to the first select gate line, and in the program operation when the second memory cell is selected, a channel of the second memory cell becomes the floating state when the fifth voltage is applied to the second select gate line.

8. The semiconductor storage device according to claim 1, further comprising:

a third memory cell connected to the word line;

a third bit line connected to the third memory cell;

a third select transistor connected between the third memory cell and the third bit line; and a third select gate line connected to the third select transistor, wherein in the program operation, the controller is configured to apply the fourth voltage to the third select gate line at the fourth timing when the third memory cell is selected, and in the program operation when the third memory cell is selected, a third time period being a difference between the second timing and the third timing, the third time period being different from each of the first time period and the second time period.

9. The semiconductor storage device according to claim 8, comprising:

a substrate;

a first conductor layer provided in a first layer above the substrate and configured to function as the word line;

a second conductor layer provided in a second layer above the first layer, and configured to function as the first select gate line;

a third conductor layer provided in the second layer and apart from the second conductor layer, and configured to function as the second select gate line;

a fourth conductor layer provided in the second layer and apart from the second conductor layer and the third conductor layer, disposed between the second conductor layer and the third conductor layer, and configured to function as the third select gate line;

a first semiconductor layer penetrating the first conductor layer and the second conductor layer;

a second semiconductor layer penetrating the first conductor layer and the third conductor layer; and a third semiconductor layer penetrating the first conductor layer and the fourth conductor layer, wherein a first intersection portion of the first conductor layer and the first semiconductor layer functions as the first memory cell, a second intersection portion of the second conductor layer and the first semiconductor layer functions as the first select transistor, a third intersection portion of the first conductor layer and the second semiconductor layer functions as the second memory cell, a fourth intersection portion of the third conductor layer and the second semiconductor layer functions as the second select transistor, a fifth intersection portion of the first conductor layer and the third semiconductor layer functions as the third memory cell; and a sixth intersection portion of the fourth conductor layer and the third semiconductor layer functions as the third select transistor.

10. The semiconductor storage device according to claim 9, wherein a resistance value of the fourth conductor layer is lower than each of a resistance value of the second conductor layer and a resistance value of the third conductor layer, and the third time is shorter than each of the first time and the second time.

11. A method of operating a semiconductor memory device, the semiconductor memory device including: a first memory cell; a second memory cell; a word line connected to the first memory cell and the second memory cell; a first select gate line configured to gate a first select transistor connected between the first memory cell and a first bit line; a second select gate line configured to gate a second select transistor connected between the second memory cell and a second bit line a substrate; a first conductor layer provided in a first layer above the substrate and configured to function as the word line; a second conductor layer in a second layer above the first layer, and configured to function as the first select gate line; a third conductor layer provided in the second layer and separate from the second conductor layer, and configured to function as the second select gate line; a first semiconductor layer penetrating the first conductor layer and the second conductor layer; and a second semiconductor layer penetrating the first conductor layer and the third conductor layer; wherein a first intersection portion of the first conductor layer and the second semiconductor layer functions as the first memory cell, a second intersection portion of the second conductor layer and the first semiconductor layer functions as the first select transistor, a third intersection portion of the first conductor layer and the second semiconductor layer functions as the second memory cell, and a fourth intersection portion of the third conductor layer and the second semiconductor layer functions as the second select transistor, the method comprising:

applying, by a controller of the semiconductor memory device, a first voltage to the first select gate line and the second select gate line at a first timing;

applying, by the controller, a second voltage lower than the first voltage to the first select gate line and the second select gate line at a second timing after the first timing;

applying, by the controller, a third voltage higher than the second voltage to the word line at a third timing after the second timing;

applying, by the controller, a fourth voltage to the first select gate line at a fourth timing after the second timing when the first memory cell is selected or to the second select gate line at the fourth timing when the second memory cell is selected, wherein the fourth voltage is between the first and second voltages; and applying, by the controller, a fifth voltage higher than the third voltage to the word line at a fifth timing after the third timing, wherein when the first memory cell is selected, a first time period is a difference between the second and third timings, and in the program operation when the second memory cell is selected, a second time period is a difference between the second and third timings, the second time being different from the first time, and wherein a resistance value of the second conductor layer is lower than a resistance value of the third conductor layer, and the first time period is shorter than the second time period.

12. The method according to claim 11, wherein the third timing and the fourth timing are the same.

13. The method according to claim 11, wherein the fourth timing precedes the third timing.

14. A semiconductor memory device comprising:

a first memory cell;

a second memory cell;

a word line connected to the first memory cell and the second memory cell;

a first bit line connected to the first memory cell;

a second bit line connected to the second memory cell;

a first select transistor connected between the first memory cell and the first bit line;

a second select transistor connected between the second memory cell and the second bit line;

a first select gate line connected to the first select transistor;

a second select gate line connected to the second select transistor;

a third memory cell connected to the word line;

a third bit line connected to the third memory cell;

a third select transistor connected between the third memory cell and the third bit line;

a third select gate line connected to the third select transistor;

a controller configured to execute a write operation that includes a program operation, wherein in the program operation, the controller is configured to apply a first voltage to the first select gate line and the second select gate line at a first timing, apply a second voltage lower than the first voltage to the first select gate line and the second select gate line at a second timing after the first timing, apply a third voltage higher than the second voltage to the word line at a third timing after the second timing, apply a fourth voltage to the first select gate line at a fourth timing after the second timing when the first memory cell is selected or to the second select gate line at the fourth timing when the second memory cell is selected, the fourth voltage between the first voltage and the second voltage, and apply a fifth voltage higher than the third voltage to the word line at a fifth timing after the third timing, in the program operation when the first memory cell is selected, a first time period being a difference between the second and third timings, and in the program operation when the second memory cell is selected, a second time period being a difference between the second and third timings, wherein the second time period is different from the first time period, wherein in the program operation, the controller is configured to apply the fourth voltage to the third select gate line at the fourth timing when the third memory cell is selected, and in the program operation when the third memory cell is selected, a third time period being a difference between the second timing and the third timing, the third time period being different from each of the first time period and the second time period;

a substrate;

a first conductor layer provided in a first layer above the substrate and configured to function as the word line;

a second conductor layer provided in a second layer above the first layer, and configured to function as the first select gate line;

a third conductor layer provided in the second layer and apart from the second conductor layer, and configured to function as the second select gate line;

a fourth conductor layer provided in the second layer and apart from the second conductor layer and the third conductor layer, disposed between the second conductor layer and the third conductor layer, and configured to function as the third select gate line;

a first semiconductor layer penetrating the first conductor layer and the second conductor layer;

a second semiconductor layer penetrating the first conductor layer and the third conductor layer; and a third semiconductor layer penetrating the first conductor layer and the fourth conductor layer, wherein a first intersection portion of the first conductor layer and the first semiconductor layer functions as the first memory cell, a second intersection portion of the second conductor layer and the first semiconductor layer functions as the first select transistor, a third intersection portion of the first conductor layer and the second semiconductor layer functions as the second memory cell, a fourth intersection portion of the third conductor layer and the second semiconductor layer functions as the second select transistor, a fifth intersection portion of the first conductor layer and the third semiconductor layer functions as the third memory cell; and a sixth intersection portion of the fourth conductor layer and the third semiconductor layer functions as the third select transistor, wherein a resistance value of the fourth conductor layer is lower than each of a resistance value of the second conductor layer and a resistance value of the third conductor layer, and the third time is shorter than each of the first time and the second time.

15. The semiconductor memory device according to claim 14, wherein the third timing and the fourth timing are the same.

16. The semiconductor memory device according to claim 14, wherein the fourth timing precedes the third timing.

* * * * *